(12) United States Patent
Strehmel et al.

(10) Patent No.: US 8,652,759 B2
(45) Date of Patent: *Feb. 18, 2014

(54) PROCESSING OF LITHOGRAPHIC PRINTING PLATES WITH A DEVELOPER SOLUTION CONTAINING A HYDROPHILIC POLYMER

(75) Inventors: Bernd Strehmel, Berlin (DE); Christopher D. Simpson, Osterode (DE); Oliver Plestert, Schwetzingen (DE); Harald Baumann, Osterode/Harz (DE)

(73) Assignee: Eastman Kodak Company, Rochester, NY (US)

(*) Notice: Subject to any disclaimer, the term of this patent is extended or adjusted under 35 U.S.C. 154(b) by 788 days.

This patent is subject to a terminal disclaimer.

(21) Appl. No.: 12/669,064

(22) PCT Filed: Aug. 21, 2008

(86) PCT No.: PCT/EP2008/060930
§ 371 (c)(1),
(2), (4) Date: Jan. 14, 2010

(87) PCT Pub. No.: WO2009/024592
PCT Pub. Date: Feb. 26, 2009

(65) Prior Publication Data
US 2010/0190110 A1    Jul. 29, 2010

(30) Foreign Application Priority Data
Aug. 23, 2007   (EP) .................................. 07114864

(51) Int. Cl.
| G03F 7/00 | (2006.01) |
| G03F 7/32 | (2006.01) |
| B41N 1/08 | (2006.01) |
| B41M 5/00 | (2006.01) |

(52) U.S. Cl.
USPC ........ 430/302; 430/434; 101/450.1; 101/453; 101/463.1

(58) Field of Classification Search
USPC ......... 101/450.1, 453, 463.1; 430/270.1, 302, 430/434, 464
See application file for complete search history.

(56) References Cited

U.S. PATENT DOCUMENTS

| 4,186,250 | A | * | 1/1980 | Garrett et al. ................. 430/302 |
| 4,401,739 | A | * | 8/1983 | Senga et al. .................... 430/16 |
| 4,873,174 | A | * | 10/1989 | Dhillon et al. ................ 430/309 |
| 5,217,813 | A |   | 6/1993 | Roser et al. |
| 6,649,319 | B2 | * | 11/2003 | Fiebag et al. ................. 430/165 |
| 2006/0057493 | A1 | * | 3/2006 | Kakino et al. ............. 430/270.1 |
| 2008/0257190 | A1 |   | 10/2008 | Thiem et al. |
| 2011/0155009 | A1 | * | 6/2011 | Strehmel et al. .............. 101/453 |

FOREIGN PATENT DOCUMENTS

| EP | 1 260 866 | 11/2002 |
| EP | 1 457 836 | 9/2004 |
| EP | 1 521 123 | 4/2005 |
| EP | 1 722 275 | 11/2006 |
| WO | WO 2006021447 A1 * | 3/2006 |
| WO | WO 2006048443 A2 * | 5/2006 |

* cited by examiner

*Primary Examiner* — Cynthia H Kelly
*Assistant Examiner* — Alyssa L Cepluch
(74) *Attorney, Agent, or Firm* — J. Lanny Tucker

(57) ABSTRACT

A method is described for producing an imaged lithographic printing plate, wherein the developer comprises a hydrophilic polymer which comprises (m1) primary, secondary and/or tertiary amino groups, and (m2) acid groups selected from —COOH, —SO$_3$H, —PO$_2$H and —PO$_3$H$_2$, and (m3) optionally alkylene oxide units —(CHR$^1$—CH$_2$—O)$_p$—, wherein R$^1$ is H or —CH$_3$ and p is an integer from 1 to 50.

19 Claims, No Drawings

PROCESSING OF LITHOGRAPHIC PRINTING PLATES WITH A DEVELOPER SOLUTION CONTAINING A HYDROPHILIC POLYMER

FIELD OF THE INVENTION

The present invention relates to a method for developing and sealing imagewise exposed lithographic printing plates in one process step, wherein the developer comprises a water-soluble hydrophilic copolymer.

BACKGROUND OF THE INVENTION

Lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source part of which is comprised of UV radiation. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened (for instance by photopolymerization) due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Alternatively, the plate can also be imagewise exposed digitally without a film e.g. by lasers. According to recent developments, plate precursors with heat-sensitive layers are used wherein by imagewise direct heating or irradiation with IR radiation that is converted into heat, differences in the developer solubility of the heated and unheated areas of the coating are generated.

Sometimes water-soluble polymers are used as temporary coatings (sometimes called "overcoat") on lithographic printing plate precursors having an oxygen-sensitive coating like a photopolymerizable coating. The water-soluble polymers have the function of protecting the coating from atmospheric oxygen during storage, exposure and in particular during the time between exposure and further processing (development and the like). During that time period the temporary coating has to exhibit a sufficient adhesion to the light-sensitive substrate so that safe handling (manufacture, packing, transport, exposure etc.) is guaranteed without tearing of the layers. Prior to the development the overcoat can is removed, preferably by washing with water or the overcoat is dissolved within the developer together with the non-image parts.

Usually, a substrate, in particular an aluminum substrate with aluminum oxide layer, is provided with a hydrophilic protective layer (also referred to as "interlayer") before the radiation-sensitive coating is applied. This hydrophilic layer improves the water acceptance of the (non-printing) background areas of a lithographic printing plate and improves the repulsion of the printing ink in these areas. A suitable hydrophilic protective layer also ensures that during developing the soluble portions of the radiation-sensitive layer are removed easily and residue-free from the substrate so that clean background areas are obtained during printing. Without such a residue-free removal, what is referred to as toning would occur during printing, i.e. the background areas would accept printing ink.

For a clean printed image it is necessary that the image areas (i.e. the imagewise remaining coating) accept the printing ink well, while the non-image areas (i.e. the imagewise revealed substrate, such as e.g. an aluminum substrate) should not accept the printing ink. In order to protect the imagewise revealed substrate, such as e.g. an aluminum substrate, against fingerprints, the formation of aluminum oxide, corrosion and mechanical attacks, such as scratches, when the printing plate is mounted in the printing machine, i.e. to maintain and possibly improve the hydrophilic nature of the non-image areas, the developed printing plate is usually subjected to a "gumming" treatment (also referred to as "finishing"). Gumming the plate prior to storing it or before long periods of standstill of the printing machine ensures that the non-image areas remain hydrophilic. When printing is started, the gumming solution has to be able to be washed off the plate quickly with the fountain solution so that the image areas are capable of accepting ink immediately. Gumming solutions have been known for a long time and are for instance disclosed in DE 29 26 645, DE 20 42 217 A1, U.S. Pat. No. 4,880,555 A1, U.S. Pat. No. 4,033,919 A1, and U.S. Pat. No. 4,162,920 A1.

DE 25 04 594 A1 discloses a gumming solution comprising phosphoric acid and a copolymer containing structural units derived from acryl amide and structural units having carboxylic groups. This gumming solution is not suitable for lithographic substrates having high adhesion to hydrophobic coatings (e.g. substrates without interlayer) because toning on press is observed for such plates.

DE 29 25 363 A1 describes a gumming composition comprising an aqueous phase and an oily phase, wherein the aqueous phase contains a hydrophilic polymer and the oily phase contains an organic solvent, a nonionic alkyl phenyl surfactant with HLB<14, an aliphatic acid ester surfactant and an anionic surfactant. While this composition provides good desensibilisation to plates with interlayer, it is not suitable for lithographic substrates having high adhesion to hydrophobic coatings (e.g. substrates without interlayer) because for such plates toning is observed. Another emulsion type surface protective agent for litho plates is disclosed in EP 943 967 A2; it is also not suitable for plates without interlayer due to toning problems.

Also the gumming compositions disclosed in U.S. Pat. Nos. 4,143,021; 414,531; 4,266,481; and U.S. Pat. No. 5,736,256 are not suitable for lithographic substrates having high adhesion to hydrophobic coatings (e.g. substrates without interlayer) because toning on press is observed.

In EP 985 546 A1 a surface protecting agent for litho plates is disclosed which is a specific copolymer of ethylene oxide and propylene oxide. The use of such an agent in a gumming solution cannot prevent toning during printing with lithographic substrates having high adhesion to hydrophobic coatings (e.g. substrates without interlayer).

EP 1 199 606 A1 discloses a process for making a negative working lithographic printing plate wherein the developing solution contains an inorganic alkali agent and a nonionic surface active agent having a polyoxyalkylene ether group. It was found that the clean up behavior of a lithographic substrate having high adhesion to hydrophobic coating (e.g. substrate without interlayer) is insufficient and strong toning was observed on press if such developing solution is used.

EP 1 600 820 A1 describes a method for processing planographic printing plate comprising (a) developing the imagewise exposed plate with a developer containing no or only up to 0.1 wt. % silicate, and (b) treating the developed plate with a protection solution containing a phosphonic acid compound at a temperature from 40 to 90° C.

EP 1 260 866 A2 discloses a method for processing an imagewise exposed lithographic printing plate comprising (a) applying a developer, and (b) rinsing the developed plate with rinse water comprising a water-soluble film-forming polymer and a phosphoric acid derivative. This method avoids an additional gumming step, however, it is not suitable for plates without hydrophilic interlayer since toning on press is observed.

DE 25 30 502 A1 describes a method for simultaneously developing and gumming printing plates, wherein the liquid used comprises besides water, a small amount of organic solvent, a water-soluble colloid like dextrin and a salt. This method, however, only works for plates having a hydrophilic interlayer.

In WO 2006/056439 A1 polymers comprising amino groups modified by acid groups and their use in fountain solutions used in the lithographic printing process are described.

For excellent performance of lithographic printing plates it is necessary to have both good hydrophilic properties of the substrate and good adhesion of the image areas (of the coating) to the substrate. Good hydrophilic properties of the substrate are necessary in order to avoid toning during printing. Therefore, very often an interlayer is applied to the substrate for improving hydrophilicity of the substrate. Unfortunately, interlayers usually deteriorate the adhesion between the printing image areas and the substrate which in turn decreases the print run length.

For improving the quality of the printed image (e.g. the image resolution) FM screens (FM=frequency-modulated) with 30 μm dot size or less have been developed where the dots become very small in size which then results in worse adhesion. For plate precursors to be imaged with FM screens, it is therefore important that there is excellent adhesion; it is, however, desired that nevertheless toning does not become an issue (i.e. the hydrophilicity of the substrate is excellent).

BRIEF SUMMARY OF THE INVENTION

It is therefore the object of the present invention to provide a process for producing an imaged lithographic printing plate which does not suffer from any toning problem and at the same time shows good adhesion of the image areas to the substrate even if no hydrophilic interlayer is present on the substrate. It is a further object of the present invention to provide such a process without the need of additional process steps.

This object is surprisingly achieved by a method comprising (a) treating an imagewise exposed lithographic printing plate precursor with an aqueous developer, having a pH value of >6 and comprising:
 (i) water,
 (ii) at least one hydrophilic polymer, comprising:
  (m1) primary, secondary and/or tertiary amino groups, and
  (m2) acid groups selected from —COOH, —SO$_3$H, —PO$_2$H$_2$ and —PO$_3$H$_2$, and
  (m3) optionally alkylene oxide units —(CHR$^1$—CH$_2$—O)$_p$—, wherein R$^1$ represents H or —CH$_3$ and p is an integer from 1 to 50,
 and
 (iii) optionally at least one member selected from surfactants, alkaline reagents, water-soluble film forming hydrophilic polymers, additives selected from organic solvents, biocides, complexing agents, buffer substances, filter dyes, antifoaming agents, anticorrosive agents and radical inhibitors; and
(b) optionally at least one step selected from rinsing with water, drying and baking.

The process of the present invention can be used for processing positive working precursors as well as negative working precursors; each of them can be sensitive to UV, Vis or IR radiation.

DETAILED DESCRIPTION OF THE INVENTION

Precursors

The process of the present invention is suitable for processing negative working precursors as well as positive working precursors; the precursors can be sensitive to UV/Vis radiation or IR radiation. In general, the lithographic printing plate precursor comprises: (i) a substrate, (ii) a radiation-sensitive coating comprising one or more layers, and (iii) optionally an oxygen-impermeable overcoat.

Examples of suitable precursors are described in the following:

Substrates

The substrate used for the precursors is preferably a dimensionally stable plate or foil-shaped material like one that has already been used as a substrate for printing matter. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the radiation-sensitive coating. Furthermore, a composite film can be used wherein an aluminum foil has been laminated onto a plastic film, such as e.g. a polyethylene terephthalate film, or paper, or a plastic film onto which aluminum has been applied by means of vapor deposition. Preferred substrates are metal substrates, wherein the term "metal substrate" as used herein also encompasses composite films with the upper-most layer being a metal layer or foil.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte or $HNO_3$, and optionally anodizing, e.g. in sulfuric acid or phosphoric acid. According to a preferred embodiment the metal substrate comprises an $Al_2O_3$-, ZnO-, $SiO_2$- or $TiO_2$-layer.

With the process of the present invention it is also possible to prepare lithographic printing plates which do not show toning although the oxide layer has defects.

An aluminum foil which preferably has a thickness of 0.1 to 0.7 mm, more preferred 0.15 to 0.5 mm, is an especially preferred substrate. It is preferred that the foil be grained (preferably electrochemically, for instance in hydrochloric acid or nitric acid) and then show an average roughness of 0.2 to 1 μm, especially preferred 0.3 to 0.8 μm.

According to an especially preferred embodiment, the grained aluminum foil was furthermore anodized (for instance in sulphonic acid). The layer weight of the resulting aluminum oxide is preferably 1.5 to 5 $g/m^2$, especially preferred 2 to 4 $g/m^2$.

A metal substrate can additionally be subjected to a post-treatment (so called "sealing") with an aqueous solution of e.g. alkali metal silicate, calcium zirconium fluoride, hexafluorosilicic acid, phosphate/fluoride, polyvinylphosphonic acid, vinylphosphonic acid copolymers, or phosphonic acid thereby providing a hydrophilizing layer (also referred to as "interlayer") on its surface. According to a preferred embodiment of the present invention, the substrate does not comprise an interlayer. It is an advantage of the present invention that substrates without interlayer i.e. substrates with high adhesion to hydrophobic coatings do not suffer from a toning problem on press if developed according to the present invention.

The details of the above-mentioned substrate treatments are well known to the person skilled in the art.

Negative Working Radiation-Sensitive Elements

Negative working coatings are described in numerous references, e.g. UV-sensitive coatings on the basis of negative diazo resins are described in EP 0 752 430 B1, photopolymer layers sensitive to 405 nm are described in DE 103 07 451, photopolymer layers sensitive to VIS are described in EP 0 684 522 B1 and IR-sensitive polymerizable systems are described e.g. in DE 199 06 823 A1, IR-sensitive systems based on acid-induced crosslinking of novolaks/resols are described in EP 625 728 A2, and EP 1 079 972 A1 discloses radical photopolymer systems sensitive for the near IR.

Photopolymerization (UV/VIS and IR)

One type of negative working coating applied onto a substrate comprises (a) at least one absorber component selected from photoinitiators and sensitizer/coinitiator systems which absorbs radiation of a wavelength in the range of 250 to 1,200 nm and is capable of initiating a free-radical polymerization, (b) a free-radical polymerizable monomer, oligomer and/or prepolymer, and optionally (c) at least one polymeric binder.

Absorber Component

The radiation-sensitive coating furthermore comprises at least one absorber component selected from photoinitiators and sensitizer/coinitiator systems.

The absorber component is selected such that it is capable of significant absorption in the range in which the radiation source to be used later on during imaging emits; preferably, the absorber shows an absorption maximum in that range. Thus, if the radiation-sensitive element is e.g. going to be imaged by means of an IR laser, the absorber should essentially absorb radiation in the range of about 750 to 1,200 nm and preferably show an absorption maximum in that range. On the other hand, if imaging is to be carried out by means of UV/VIS radiation, the absorber should essentially absorb radiation in the range of about 250 to 750 nm and preferably show an absorption maximum in that range. Suitable photoinitiators and/or sensitizers are known to the person skilled in the art, or it can easily be determined whether significant absorption occurs in the desired wave length range by means of simple tests (e.g. recording an absorption spectrum).

In the present invention, a photoinitiator is a compound capable of absorbing radiation when exposed and of forming free radicals by itself, i.e. without the addition of coinitiators. Examples of suitable photoinitiators absorbing UV or VIS radiation include triazine derivatives with 1 to 3 $CX_3$ groups (wherein every X is independently selected from a chlorine or bromine atom, and is preferably a chlorine atom), hexaarylbisimidazole compounds, benzoin ethers, benzil ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, and 2-(4-ethoxy-naphtho-1-yl)-4,6-bis(trichloromethyl)-s-triazine and 2-[4-(2-ethoxyethyl)-naphtho-1-yl]-4,6-bis (trichloro-methyl)-s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and dicyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt-%, based on the dry layer weight, especially preferred 0.5 to 15 wt-%.

A sensitizer as referred to in the present invention is a compound which can absorb radiation when it is exposed but which cannot by itself, i.e. without the addition of coinitiators, form free radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyrrylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

Coumarin sensitizers of formula (I) are for example suitable for the UV range of the electromagnetic spectrum:

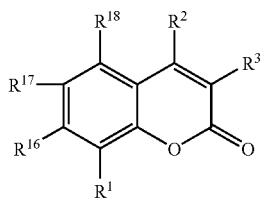

(I)

wherein
$R^1$, $R^{16}$, $R^{17}$ and $R^{18}$ are independently selected from —H, a halogen atom, $C_1$-$C_{20}$ alkyl, —OH, —O—$R^4$ and —$NR^5R^6$, wherein $R^4$ is $C_1$-$C_{20}$ alkyl, $C_5$-$C_{10}$ aryl or $C_6$-$C_{30}$ aralkyl (preferably $C_1$-$C_6$ alkyl) and $R^5$ and $R^6$ are independently selected from a hydrogen atom and $C_1$-$C_{20}$ alkyl, or $R^1$ and $R^{16}$, $R^{16}$ and $R^{17}$ or $R^{17}$ and $R^{18}$ together form a 5- or 6-membered heterocyclic ring with a heteroatom, selected from N and O, in one or both positions adjacent to the phenyl ring shown in formula (I), or $R^{16}$ or $R^{17}$ forms, together with its two adjacent substituents, a 5- or 6-membered heterocyclic ring with a heteroatom, selected from N and O, in one or both positions adjacent to the phenyl ring shown in formula (I), wherein each formed 5- or 6-membered heterocyclic ring can independently be substituted with one or more $C_1$-$C_6$ alkyl groups, with the proviso that at least one of $R^1$, $R^{16}$, $R^{17}$ and $R^{18}$ is different from hydrogen and $C_1$-$C_{20}$ alkyl, $R^2$ is a hydrogen atom, $C_1$-$C_{20}$ alkyl, $C_5$-$C_{10}$ aryl or $C_6$-$C_{30}$ aralkyl and $R^3$ is a hydrogen atom or a substituent selected from —COOH, —COOR$^7$, —COR$^8$, —CONR$^9$R$^{10}$, —CN, $C_5$-$C_{10}$ aryl, $C_6$-$C_{30}$ aralkyl, a 5- or 6-membered heterocyclic optionally benzofused group, a group —CH═CH—R$^{12}$ and

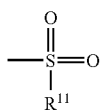

wherein $R^7$ is $C_1$-$C_{20}$ alkyl, $R^8$ is $C_1$-$C_{20}$ alkyl or a 5- or 6-membered heterocyclic group, $R^9$ and $R^{10}$ are independently selected from a hydrogen atom and $C_1$-$C_{20}$ alkyl, $R^{11}$ is $C_1$-$C_{12}$ alkyl or alkenyl, a heterocyclic non-aromatic ring or $C_5$-$C_{20}$ aryl optionally with a heteroatom, selected from O, S and N, and $R^{12}$ is $C_5$-$C_{10}$ aryl or a 5- or 6-membered heterocyclic, optionally aromatic, ring;

or $R^2$ and $R^3$, together with the carbon atoms to which they are bonded, form a 5- or 6-membered, optionally aromatic, ring.

They are described in more detail e.g. in WO 2004/049068 A1.

Furthermore, bisoxazole derivatives and analogues of the formula (II) are suitable for the UV range

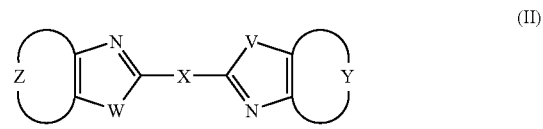

(II)

wherein X is a spacer group comprising at least one C—C double bond conjugated to the heterocycles, Y and Z independently represent an optionally substituted fused aromatic ring and V and W are independently selected from O, S and NR, wherein R is an alkyl, aryl or aralkyl group which can optionally be mono- or polysubstituted, as described in more detail in WO 2004/074929 A2, and oxazole compounds of the formula (III)

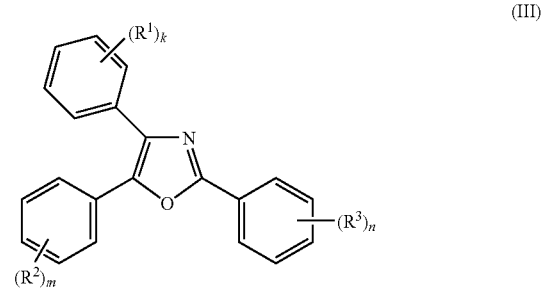

(III)

wherein each $R^1$, $R^2$ and $R^3$ is independently selected from a halogen atom, an optionally substituted alkyl group, an optionally substituted aryl group, which may also be fused, an optionally substituted aralkyl group, a group —NR$^4$R$^5$ and a group —OR$^6$, wherein $R^4$ and $R^5$ are independently selected from a hydrogen atom, an alkyl, aryl or aralkyl group, $R^6$ is an optionally substituted alkyl, aryl or aralkyl group or a hydrogen atom, and k, m and n are independently 0 or an integer from 1 to 5, as described in detail in WO 2004/074930 A2.

The 1,4-dihydropyridine compounds of formula (IV) as described in WO 2004/111731 A1 are an example of another class of sensitizers suitable for the UV range

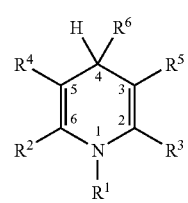

(IV)

wherein
$R^1$ is selected from a hydrogen atom, —C(O)OR$^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —C(O)OR$^7$, —C(O)R$^7$, —C(O)NR$^8$R$^9$ and CN, or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —NR$^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

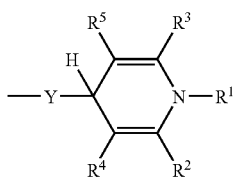

Y is an alkylene or arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

The sensitizers of formulas (V), (VI), (VII), and (VIII) are also suitable for UV sensitive elements. They are especially suitable for plates imaged by 30 μm (and lower) FM screening (FM=frequency-modulated):

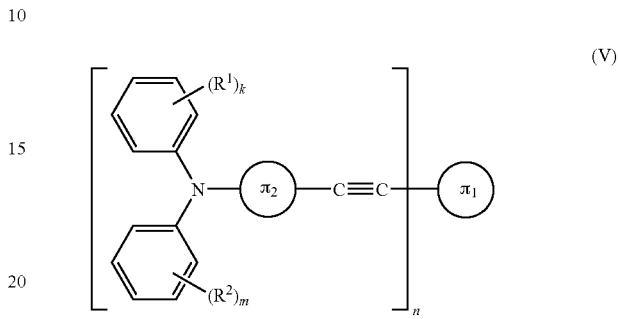

wherein $\pi_1$ and each $\pi_2$ independently represent an aromatic or heteroaromatic unit, each $R^1$ and $R^2$ is independently selected from a halogen atom, an alkyl, aryl or aralkyl group, a group —NR$^4$R$^5$ or a group —OR$^6$, $R^4$, $R^5$ and $R^6$ are independently selected from an alkyl, aryl and aralkyl group and n is an integer of at least 2 and k and m independently represent 0 or an integer from 1 to 5;

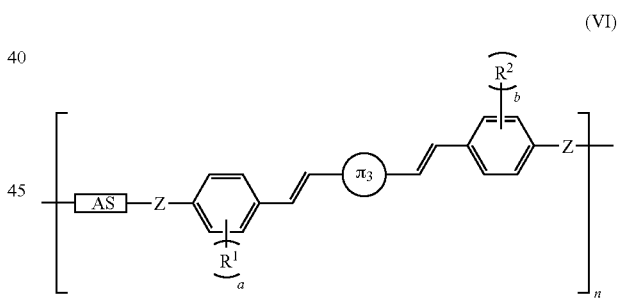

wherein $\pi_3$ is an aromatic or heteroaromatic unit or a combination of the two so that a conjugated π-system is present between the two groups Z in structure (VI), each Z independently represents a heteroatom connecting the spacer AS and the conjugated system, each $R^1$ and $R^2$ is independently selected from a halogen atom, an alkyl, aryl, alkylaryl or aralkyl group, a group —NR$^3$R$^4$ and a group —OR$^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer, described in more detail in DE 10 2004 055 733;

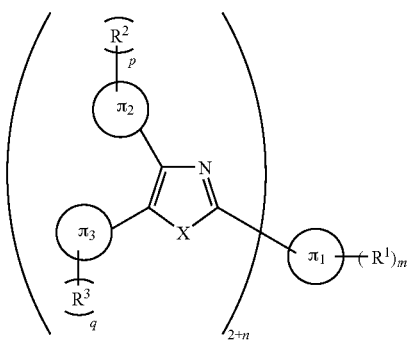

wherein

X is selected from O, S and Se;

n represents 0 or a positive integer;

m, p and q are independently 0 or a positive integer;

the π-units $\overset{\frown}{\pi_1}$, $\overset{\frown}{\pi_2}$ and $\overset{\frown}{\pi_3}$ are independently unsaturated units, each with a conjugated π-electron system, which are covalently bonded to the heterocyclic unit

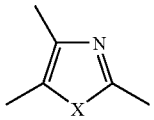

and together with this unit again form a conjugated π-electron system and each group $R^1$, $R^2$ and $R^3$ is independently selected from a hydrogen atom, a halogen atom, an alkyl group, an aralkyl group, a group —$NR^4R^5$ and a group —$OR^6$, wherein $R^4$, $R^5$ and $R^6$ are independently selected from an alkyl group, aryl group and aralkyl group, described in more detail in DE 10 2004 022 137 B3;

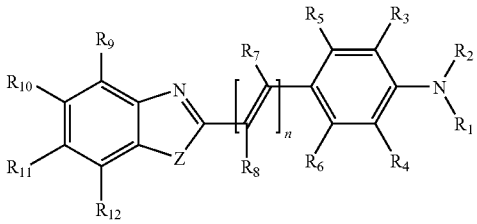

wherein $R_1$ and $R_2$ are independently selected from the group consisting of hydrogen, unsubstituted and substituted aryl, unsubstituted and substituted heteroaryl and unsubstituted and substituted alkyl, said aryl or heteroaryl group being linked to $R_3$ or $R_4$ to form a 5- or 6-membered N-heteroaryl ring or not being linked to $R_3$ and $R_4$; provided that at least one of the groups $R_1$ and $R_2$ is an unsubstituted or substituted aryl or heteroaryl group;

or $R_1$ and $R_2$ together with the nitrogen atom to which they are attached form an N-heteroaryl group which either exhibits one or two fused benzene rings or does not exhibit any fused benzene rings;

$R_3$ and $R_4$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —$SO_2R$, —$SO_3R$, —$NO_2$, $NR_2$, $NR_3^+$, and —$PO_3R_2$, wherein each R is selected from H, alkyl, aryl, aralkyl and alkylaryl, or $R_3$ or $R_4$ are linked to an aryl or heteroaryl group represented by $R_1$ or $R_2$ to form a 5- or 6-membered N-heteroaryl ring;

$R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —$SO_2R$, —$SO_3R$, —$NO_2$, $NR_2$, $NR_3^+$, and —$PO_3R_2$, wherein each R is selected from the group consisting of H, alkyl, aryl, aralkyl and alkylaryl, or, if $R_3$ and $R_4$ are not linked to $R_1$ and $R_2$, respectively, $R_5$ and $R_3$ and/or $R_6$ and $R_4$ form a 5- or 6-membered fused aromatic ring;

$R_7$ and $R_8$ are independently selected from the group consisting of hydrogen, CN, halogen, and unsubstituted and substituted alkyl, alkylaryl, aralkyl, and aryl;

n is selected from 0, 1 and 2;

Z represents O, S, Se or NR, wherein R is selected from the group consisting of hydrogen, alkyl, aryl, aralkyl and alkylaryl;

$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —$SO_2R$, —$SO_3R$, —$NO_2$, $NR_2$, $NR_3^+$, and —$PO_3R_2$, wherein each R is selected from the group consisting of H, alkyl, aryl, aralkyl and alkylaryl, provided that at least one of the groups $R_9$ to $R_{12}$ is a bulky group which has a van der Waals volume of at least 55 Å$^3$.

If the radiation-sensitive elements are to be exposed with VIS laser diodes, the cyanopyridone derivatives described in WO 03/069411 A1 are for example suitable as sensitizers.

For IR-sensitive elements, the sensitizers are for example selected from carbon black, phthalocyanine pigments/dyes and pigments/dyes of the polythiophene, squarylium, thiazolium, croconate, merocyanine, cyanine, indolizine, pyrylium or metaldithiolin classes, especially preferred from the cyanine class. The compounds mentioned in Table 1 of U.S. Pat. No. 6,326,122 for example are suitable IR absorbers. Further examples can be found in U.S. Pat. No. 4,327,169, U.S. Pat. No. 4,756,993, U.S. Pat. No. 5,156,938, WO 00/29214, U.S. Pat. No. 6,410,207 and EP 1 176 007 A1.

According to one embodiment, a cyanine dye of formula (IX)

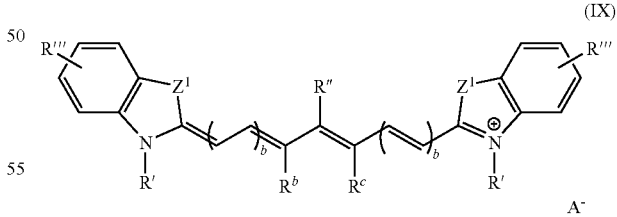

is used, wherein each $Z^1$ independently represents S, O, $NR^a$ or C(alkyl)$_2$;

each R' independently represents an alkyl group, an alkylsulfonate group or an alkylammonium group;

R" represents a halogen atom, $SR^a$, $OR^a$, $SO_2R^a$ or $NR^a_2$;

each R''' independently represents a hydrogen atom, an alkyl group, —$COOR^a$, —$OR^a$, —$SR^a$, —$NR^a_2$ or a halogen atom; R''' can also be a benzofused ring;

A$^-$ represents an anion;

$R^b$ and $R^c$ either both represent hydrogen atoms or, together with the carbon atoms to which they are attached, form a carbocyclic five- or six-membered ring;
$R^a$ represents a hydrogen atom, an alkyl or aryl group;
each b is independently 0, 1, 2 or 3.

If R' represents an alkylsulfonate group, an internal salt can form so that no anion K is necessary. If R' represents an alkylammonium group, a second counterion is needed which is the same as or different from $A^-$.

Of the IR dyes of formula (IX), dyes with a symmetrical structure are especially preferred. Examples of especially preferred dyes include 2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indolium tosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium tosylate and 2-[2-[2-chloro-3-[2-ethyl-(3H-benzthiazole-2-ylidene)-ethylidene]-1-cyclohexene-1-yl]-ethenyl]-3-ethyl-benzothiazolium tosylate.

The following compounds are also IR absorbers suitable for the present invention:

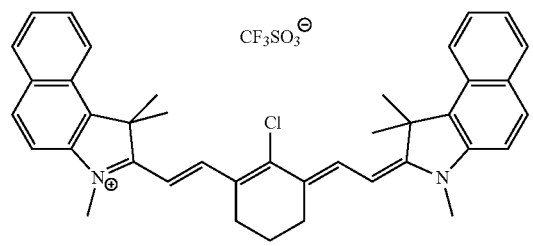
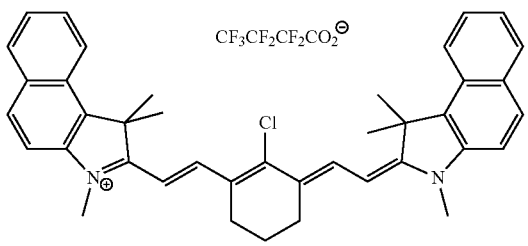
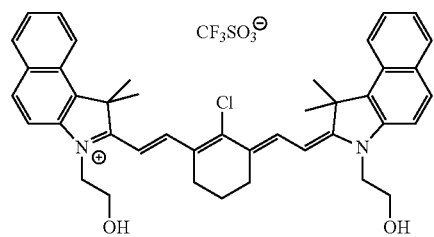
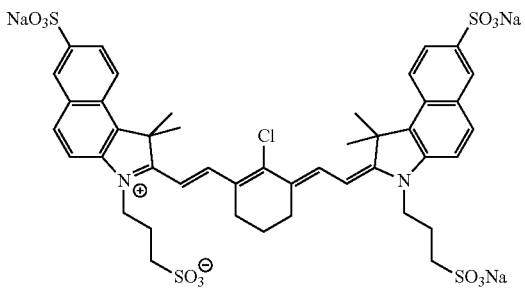
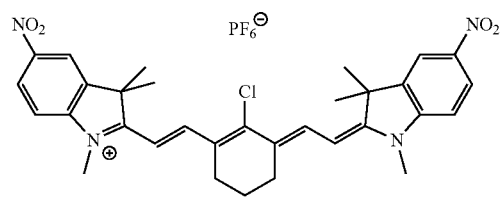
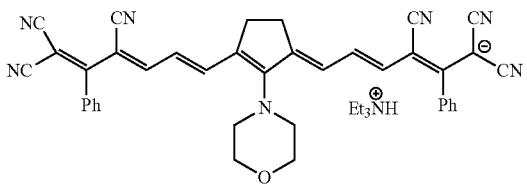
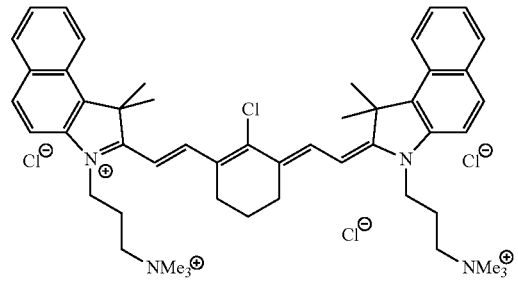
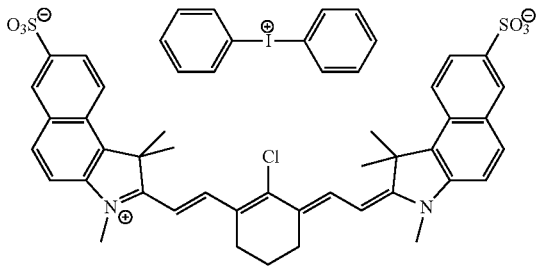
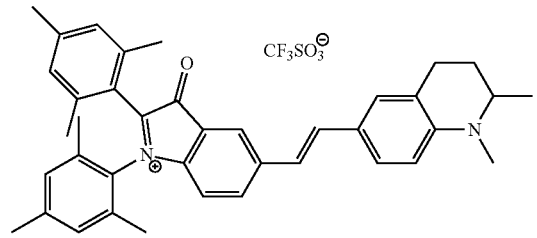
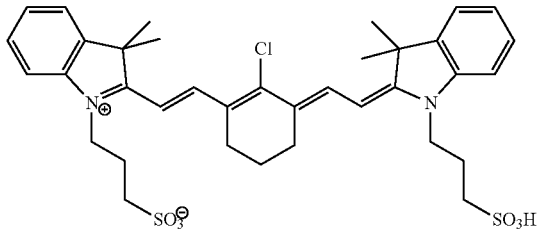

-continued
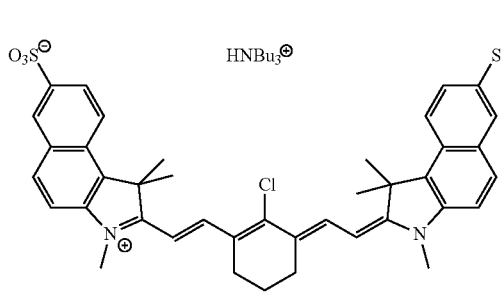
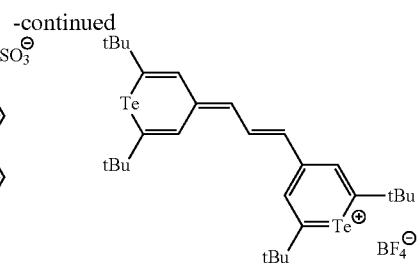
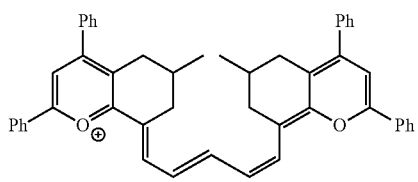
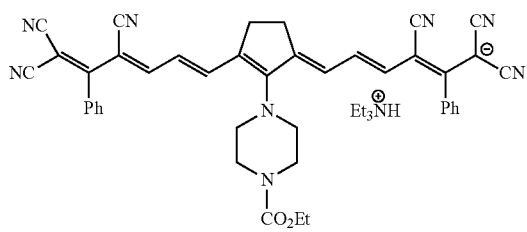
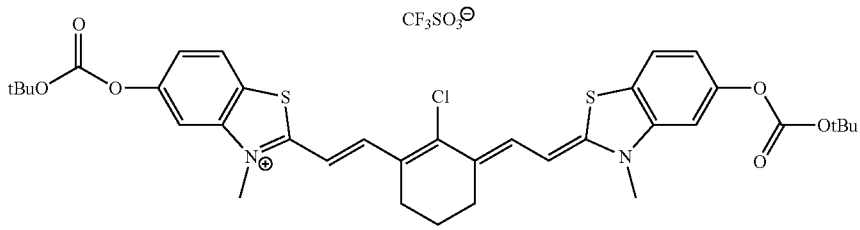
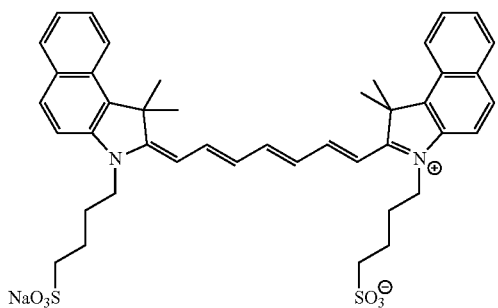
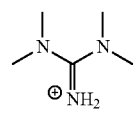
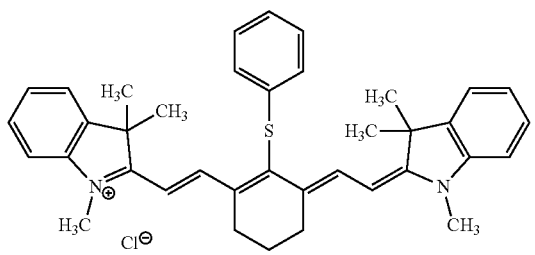
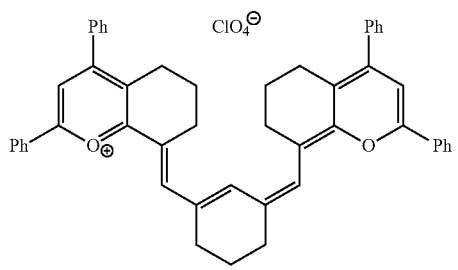
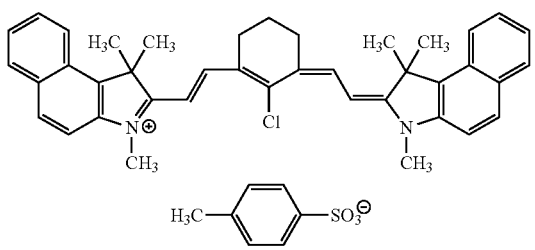

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt-%, based on the dry layer weight, especially preferred 0.5 to 10 wt-%. If both photoinitiators and sensitizers are present in the coating, their total amount is preferably 0.5 to 30 wt-%, based on the dry layer weight, especially preferred 1 to 15 wt-%.

A coinitiator as referred to in the present invention is a compound that is essentially unable to absorb when irradiated but forms free radicals together with the radiation-absorbing sensitizers used in the present invention. The coinitiators are for example selected from onium compounds, for example those where the onium cation is selected from iodonium (such as e.g. triaryliodonium salts), sulfonium (such as triarylsulfonium salts), phosphonium, oxylsulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl; N-arylglycines and derivatives thereof (e.g. N-phenylglycine); aromatic sulfonyl halides; trihalomethylarylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof and other coinitiators described in U.S. Pat. No. 5,629,354); hexaarylbiimidazoles; thiol compounds (e.g. mercaptobenzthiazole, mercaptobenzimidazole and mercaptotriazole); 1,3,5-triazine derivatives with 1 to 3 $CX_3$ groups (wherein every X is independently selected from a chlorine or bromine atom, and is preferably a chlorine atom), such as e.g. 2-phenyl-4,6-bis(tri-chloromethyl)-s-triazine, 2,4,6-tris(trichloromethyl)-s-triazine, 2-methyl-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; oxime ethers and oxime esters, such as for example those derived from benzoin; metallocenes (preferably titanocenes, and especially preferred those with two five-membered cyclodienyl groups, such as e.g. cyclopentadienyl groups and one or two six-membered aromatic groups with at least one ortho fluorine atom and optionally also a pyrryl group, such as bis(cyclopentadienyl)-bis-[2,6-difluoro-3-(pyrr-1-yl)-phenyl]titanium and dicyclopentadiene-bis-2,4,6-trifluorophenyl-titanium or zirconium); acylphosphine oxides, diacylphosphine oxides and peroxides (e.g. those listed in EP-A1-1 035 435 as activators of the type of an organic peroxide), α-hydroxy or α-amino acetophenones, acylphosphines, acylphosphinesulfides, carbonyl compounds such as aromatic ketones or quinones, e.g. benzophenone derivatives, Michler's ketone, thioxanthone derivatives, anthraquinone derivatives and fluorenone derivatives.

Suitable 2,2',4,4',5,5'-hexaarylbiimidazoles (in the following simply referred to as hexaarylbiimidazoles) are represented by the following formula (X):

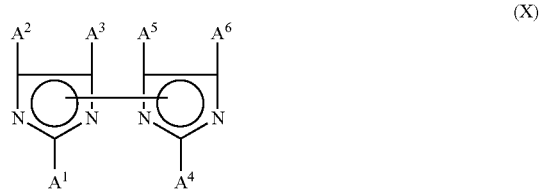

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-Bis(bromophenyl)-4,4',5,5'-tetraphenylbiimidazole,
2,2'-bis(p-carboxyphenyl)-4,4',5,5'-tetraphenylbiimidazole,
2,2'-bis(o-chlorophenyl)-4,4',5,5'-tetrakis(p-methoxyphenyl)biimidazole,
2,2'-bis(p-chlorophenyl)-4,4',5,5'-tetrakis(p-methoxyphenyl)biimidazole,
2,2'-bis(p-cyanophenyl)-4,4'5,5'-tetrakis(p-methoxyphenyl) biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl) biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenylbiimidazole, 2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)biimidazole,
2,2'-di-9-phenanthryl-4,4',5,5'-tetrakis(p-methoxyphenyl)biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-benzylthiophenyl)biimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl)biimidazole, and
2,2'-bis(2-chloro-5-sulfophenyl)-4,4',5,5'-tetraphenylbiimidazole,
and especially preferred:
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl)biimidazole,
2,2'-bis(o-chlorophenyl)-4,4',5,5'-tetra(o,p-dibromophenyl)biimidazole,
2,2'-bis(o-bromophenyl)-4,4',5,5'-tetra(o,p-dichlorophenyl)biimidazole or
2,2'-bis(o,p-dichlorophenyl)-4,4',5,5',-tetra(o,p-dichlorophenyl)biimidazole;
but the invention is not restricted to these compounds.

Suitable hexaarylbiimidazoles can be prepared according to known methods (see e.g. U.S. Pat. No. 3,445,232). A preferred process is the oxidative dimerization of corresponding triarylimidazoles with iron-(III)-hexacyanoferrate (II) in an alkali solution.

It is irrelevant for the purposes of the present invention which hexaarylbiimidazole isomer (or mixture of isomers) is used (e.g. 1,2'-, 1,1'-, 1,4', 2,2'-, 2,4'- and 4,4'-isomer), as long as it is photodissociable and provides triarylimidazolyl free radicals in the process.

The trihalogenmethyl compounds suitable as coinitiators are capable of forming free radicals. Trihalogenmethyl-substituted triazines and trihalogenmethyl-arylsulfones are preferred. The following can be mentioned as examples (without restricting the invention to these compounds):
2-(4-Methoxyphenyl)-4,6-bis(trichloromethyl)-s-triazine,
2-(4-chlorophenyl)-4,6-bis-(trichloromethyl)-s-triazine,
2-phenyl-4,6-bis(trichloromethyl)-s-triazine,
2,4,6-tris-(trichloromethyl)-s-triazine,
2,4,6-tris-(tribromomethyl)-s-triazine and
tribromomethylphenylsulfone.

Many coinitiators can also function as photoinitiators when they are exposed in their absorption band. This way, photosensitive layers can be obtained that are e.g. sensitive over a wide spectral range because a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. In this case, the coinitiator functions as an actual coinitiator in the sense of the definition given above for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt-%, based on the dry layer weight, especially preferred 0.5 to 15 wt-%.

Further examples of suitable sensitizers and coinitiators for IR-sensitive coatings are also mentioned in WO 2004/041544, WO 2000/48836 and DE 10 2004 003143.

Free-Radical Polymerizable Component

All monomers, oligomers and polymers which comprise at least one C—C double bond can be used as free-radical polymerizable monomers, oligomers and polymers. Monomers/oligomers/polymers with C—C triple bonds can also be used, but they are not preferred. Suitable compounds are well known to the person skilled in the art and can be used in the present invention without any particular limitations. Esters of acrylic and methacrylic acids, itaconic acid, crotonic and isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, pentaerythritol triacrylate and trimethacrylate, dipentaerythritolmonohydroxy pentaacrylate and pentamethacrylate, dipentaerythritol hexaacrylate and hexamethacrylate, pentaerythritol tetraacrylate and tetramethacrylate, ditrimethylol propane tetraacrylate and tetramethacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride copolymers and hydroxyalkyl(meth)acrylates (cf. e.g. DE 4 311 738 C1); (meth)acrylic acid polymers, partially or fully esterified with allyl alcohol (cf. e.g. DE 3 332 640 A1); reaction products of polymeric polyalcohols and isocyanatoalkyl(meth)acrylates; unsaturated polyesters; (meth)acrylate-terminated polystyrenes, poly(meth)acrylic acid ester, poly(meth)acrylic acids, poly(meth)acrylamides; (meth)acrylic acid polymers, partially or fully esterified with epoxides comprising free-radical polymerizable groups; and polymers with allyl side-groups which can for example be obtained by polymerization of allyl(meth)acrylate, optionally with further comonomers.

Free-radical polymerizable compounds that can be used in the present invention also include compounds that have a molecular weight of 3,000 or less and are reaction products obtained by reacting a diisocyanate with (i) an ethylenically unsaturated compound with one hydroxy group, and at the same time (ii) a saturated organic compound with one NH group and one OH group, wherein the reactants are used in amounts according to the following condition:

Number of moles of isocyanate groups≤number of moles of OH plus NH groups.

Examples of diisocyanates are represented by the following formula:

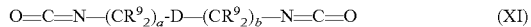

$$O=C=N-(CR^9{}_2)_a-D-(CR^9{}_2)_b-N=C=O \quad (XI)$$

wherein a and b independently represent 0 or an integer from 1 to 3, each $R^9$ is independently selected from H and $C_1$-$C_3$ alkyl and D is a saturated or unsaturated spacer which can optionally comprise further substituents in addition to the two isocyanate groups. D can be a chain-shaped or a ring-shaped unit. As used in the present invention, the term "diisocyanate" refers to an organic compound comprising two isocyanate groups but no OH groups and no secondary and primary amino groups.

D can for example be an alkylene group $(CH_2)_w$, wherein w is an integer from 1 to 12, preferably 1 to 6, and one or more hydrogen atoms are optionally replaced with substituents such as e.g. alkyl groups (preferably $C_1$-$C_6$), a cycloalkylene group, an arylene group or a saturated or unsaturated heterocyclic group.

The ethylenically unsaturated compound (i), which comprises a hydroxy group, comprises at least one non-aromatic C—C double bond, which is preferably terminal. The hydroxy group is preferably not bonded to a doubly bonded carbon atom; the hydroxy group is not part of a carboxy group. In addition to the one OH group, the ethylenically unsaturated compound (i) does not comprise any further functional groups, such as e.g. NH, which can react with the isocyanate.

Examples of the ethylenically unsaturated compound (i) include

Hydroxy($C_1$-$C_{12}$)alkyl(meth)acrylates (e.g. 2-hydroxyethyl(meth)acrylate, 2- or 3-hydroxypropyl(meth)acrylate, 2-, 3- or 4-hydroxybutyl(meth)acrylate), hydroxy($C_1$-$C_{12}$)alkyl(meth)acrylamides (e.g. 2-hydroxyethyl(meth)acrylamide, 2- or 3-hydroxypropyl(meth)acrylamide, 2-, 3- or 4-hydroxybutyl(meth)acrylamide), mono(meth)acrylates of oligomeric or polymeric ethylene glycols or propylene glycols (e.g. polyethylene glycol mono(meth)acrylate, triethylene glycol mono(meth)acrylate), allyl alcohol, pentaerythritol tri(meth)acrylate, 4-hydroxy($C_1$-$C_{12}$)alkylstyrene (e.g. 4-hydroxymethylstyrene), 4-hydroxystyrene, hydroxycyclohexyl(meth)acrylate.

The term "(meth)acrylate" as used in the present invention indicates that both methacrylate and acrylate etc. are meant.

The saturated organic compound (ii) is a compound with one OH and one NH group.

The saturated organic compound (ii) can for example be represented by the following formula (XII) or (XIII)

$$R^{10}-N-E-OH \quad (XII)$$
$$\phantom{R^{10}-N}|$$
$$\phantom{R^{10}-N}H$$

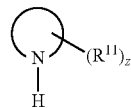

(XIII)

wherein $R^{10}$ is a straight-chain (preferably $C_1$-$C_{12}$, especially preferred $C_1$-$C_4$), branched (preferably $C_3$-$C_{12}$, especially preferred $C_3$-$C_6$) or cyclic (preferably $C_3$-$C_8$, especially preferred $C_5$-$C_6$) alkyl group, E is a straight-chain (preferably $C_1$-$C_6$, especially preferred $C_1$-$C_2$), branched (preferably $C_3$-$C_{12}$, especially preferred $C_3$-$C_6$) or cyclic (preferably $C_3$-$C_8$, especially preferred $C_5$-$C_6$) alkylene group,

represents a saturated heterocyclic ring with 5 to 7 ring atoms, which in addition to the nitrogen atom shown above optionally comprises another heteroatom selected from S, O and $NR^{12}$, wherein $R^{12}$ is an alkyl group optionally substituted with an OH group, R" is OH or a straight-chain, branched or cyclic alkyl group substituted with an OH group, and z=0 if the heterocyclic ring comprises $NR^{12}$ and $R^{12}$ is an alkyl group substituted with OH and z=1 if the saturated heterocyclic ring does not comprise $NR^{12}$ or if the saturated heterocyclic ring comprises $NR^{12}$ and $R^{12}$ is an unsubstituted alkyl group.

The number of moles of isocyanate groups must not exceed the number of moles of OH groups and NH groups combined since the product should not comprise any more free isocyanate groups.

Additional suitable C—C unsaturated free-radical polymerizable compounds are described e.g. in EP 1 176 007 A2.

It is of course possible to use different kinds of monomers, oligomers or polymers in the mixture; furthermore, mixtures of monomers and oligomers and/or polymers can be used in the present invention, as well as mixtures of oligomers and polymers.

The free-radical polymerizable component is preferably used in an amount of 5 to 95 wt-%, based on the dry layer weight, especially preferred 10 to 85 wt-%.

Binders

Suitable binders are polymers/copolymers soluble or dispersible in aqueous alkaline developer, such as e.g. phenolic resins such as novolaks and resols, and copolymers of (meth) acrylic acid, N-phenylmaleimide and (meth)acrylamide (see DE 199 36 331).

Further suitable binders are "reactive binders", i.e. polymeric binders having side chains comprising free radical polymerizable groups. For example the reactive side groups are selected from acryl, methacryl, styryl, allyl, and mixtures of two or more thereof. The polymer backbone is not limited and is for example selected from an acrylic backbone, methacrylic backbone, acetal backbone, urethane backbone, and styrene backbone; copolymers of the aforementioned are also possible. Suitable reactive binders are disclosed in a number of patent applications e.g. WO 2004/014652 A1, WO 89/06659 A1, DE 29 03 270 A1, WO 95/12147, EP 410 242, and U.S. Pat. No. 4,035,321.

The total amount of binders is preferably 5 to 95 wt-%, based on the dry layer weight, especially preferred 10 to 85 wt-%.

Negative Diazo-Systems (UV-Sensitive)

Another type of negative working UV-sensitive coating—applied onto a substrate—comprises a diazonium polycondensation product.

Diazonium polycondensation products known to the person skilled in the art can be used as diazonium polycondensation product. Such condensation products can for example be prepared according to known methods by condensing a diazo monomer described in EP-A-0 104 863 with a condensation agent such as formaldehyde, acetaldehyde, propionaldehyde, butyraldehyde, isobutyraldehyde or benzaldehyde. Furthermore, co-condensation products are used which in addition to the diazonium salt units also comprise other units which are not photosensitive and are derived from condensable compounds, in particular aromatic amines, phenols, phenol ethers, aromatic thiol ethers, aromatic hydrocarbons, aromatic heterocycles and organic acid amides. Especially advantageous examples of the diazonium polycondensation products include reaction products of diphenylamine-4-diazonium salts, which optionally contain a methoxy group in the phenyl group carrying the diazo group, and formaldehyde or 4,4'-bismethoxymethyldiphenylether. Aromatic sulfonates such as 4-tolylsulfonate or mesitylene sulfonate, tetrafluoroborate, hexafluorophosphate, hexafluoroantimonate and hexafluoroarsenate are especially suitable as anions of these diazo resins. The diazonium polycondensation product is preferably present in an amount of 3 to 60 wt-% in the photosensitive composition.

Hybrid systems of diazonium polycondensation products and the above-mentioned UV-sensitive free-radical polymerizable system can also be used in the negative working radiation-sensitive coating.

Suitable binders for such systems are polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331). The total amount of binders is preferably 5 to 95 wt-%, based on the dry layer weight, especially preferred 10 to 85 wt-%.

Single-Layer Negative Working IR-Sensitive Elements

Another type of negative working single-layer IR-sensitive elements are elements wherein the radiation-sensitive layer on a substrate is rendered insoluble in or impenetrable by aqueous alkaline developer upon IR irradiation and comprises
(i) at least one compound which forms an acid upon the application of heat (in the following also referred to as "latent Bronsted acid"), and
(ii) a component cross-linkable by an acid (in the following also referred to as "cross-linking agent") or a mixture thereof and
(iii) at least one IR absorber.

Systems based on this principle are for example described in EP 0 625 728 B1 and EP 0 938 413 B1.

All the sensitizers described above which absorb radiation from the IR range (more than 750 to 1,200 nm) can be used as IR absorbers.

Ionic and nonionic Bronsted acids can be used as latent Bronsted acid. Examples of ionic latent Bronsted acids include onium salts, in particular iodonium, sulfonium, oxysulfoxonium, oxysulfonium, phosphonium, selenonium, telluronium, diazonium and arsonium salts. Specific examples are diphenyliodonium-hexafluorophosphate, triphenylsulfonium-hexafluoroantimonate, phenylmethyl-orthocyanobenzylsulfonium-tri-fluoromethanesulfonate and 2-methoxy-4-aminophenyl-diazonium-hexafluorophosphate.

Examples of nonionic latent Bronsted acids include $RCH_2X$, $RCHX_2$, $RCX_3$, $R(CH_2X)_2$ and $R(CH_2X)_3$, wherein X represents Cl, Br, F or $CF_3SO_3$ and R is an aromatic, aliphatic or araliphatic group.

Ionic latent Bronsted acids of the formula

are also suitable, wherein if X represents iodine, $R^{1c}$ and $R^{1d}$ are free electron pairs and $R^{1a}$ and $R^{1b}$ are aryl groups or substituted aryl groups, if X represents S or Se, $R^{1d}$ is a free electron pair and $R^{1a}$, $R^{1b}$, $R^{1c}$ are independently selected from aryl groups, substituted aryl groups, an aliphatic group or substituted aliphatic group, if X represents P or As, $R^{1d}$ can be an aryl group, substituted aryl group, aliphatic group or substituted aliphatic group, and wherein W is selected from $BF_4$, $CF_3SO_3$, $SbF_6$, $CCl_3CO_2$, $ClO_4$, $AsF_6$ or $PF_6$.

$C_1$-$C_5$-alkyl sulfonates, arylsulfonates (e.g. benzoin tosylate, 2-hydroxymethylbenzoin tosylate and 2,6-dinitrobenzyl tosylate) and N—$C_1$-$C_{15}$-alkyl-sulfonylsulfonamides (e.g. N-methanesulfonyl-p-toluene-sulfonamide and N-methanesulfonyl-2,4-dimethylbenzene-sulfonamide) are also suitable.

Specific suitable onium compounds are for example listed in detail in U.S. Pat. No. 5,965,319 as formulas (I) to (III).

The latent Bronsted acids are preferably used in an amount of 0.5 to 50 wt-%, especially preferred 3 to 20 wt-%, based on the dry layer weight.

The cross-linking agent can for example be a resin, selected from resols, $C_1$-$C_5$-alkoxymethylmelamines, $C_1$-$C_5$-alkoxymethyl-glycoluril resins, poly($C_1$-$C_5$-alkoxy-methylstyrenes) and poly($C_1$-$C_5$-alkoxymethylacrylamides), epoxidized novolak resins and urea resins. In particular, compounds comprising at least 2 groups in a molecule, selected from hydroxymethyl, alkoxymethyl, epoxy and vinylether groups, bonded to an aromatic ring, can be used as cross-linking agents; of those, phenol derivatives with at least 2 groups selected from hydroxymethyl and alkoxymethyl groups, bonded to a benzene ring, 3 to 5 benzene rings and a molecular weight of 1,200 or less, as listed in columns 31 to 37 of U.S. Pat. No. 5,965,319, are preferred.

The cross-linking agent is preferably used in an amount of 5 to 90 wt-%, based on the dry layer weight, especially preferred 10 to 60 wt-%.

The radiation-sensitive layers of this type can contain binders, for example selected from alkali-soluble or dispersible (co)polymers, such as novolaks, acetone pyrogallol resin, polyhydroxystyrenes and hydroxystyrene-N-substituted maleimide-copolymers as listed in U.S. Pat. No. 5,965,319 as component (C), polymers as mentioned in U.S. Pat. No. 5,919,601 as binder resins and copolymers as described in DE 199 36 331.

Preferably binders are present in an amount of 5 to 95 wt-%, based on the dry layer weight, especially preferred 5 to 60 wt-%.

In principle, known IR-sensitive elements with a single-layer structure, as for example described in U.S. Pat. No. 5,919,601 and WO 00/17711 A1, can be processed according to the present invention.

Positive Working Radiation-Sensitive Elements

UV-Sensitive

Positive working UV-sensitive elements can for example be based on quinone diazides (preferably naphthoquinone diazides) and novolaks, as for example described in U.S. Pat. No. 4,594,306.

Suitable binders for such coatings are for instance polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331). The total amount of binders is preferably 5 to 95 wt-%, based on the dry layer weight, especially preferred 10 to 85 wt-%.

IR-Sensitive

There are numerous examples of positive working IR-sensitive elements, which can be divided into two groups: those with one layer and those with two layers.

Single-Layer Plates

Usually, single-layer positive working IR-sensitive elements comprise
(a) an optionally pretreated substrate
(b) a positive working heat-sensitive layer comprising
  (i) at least one polymer soluble in aqueous alkaline developer, such as e.g. a novolak resin,
  (ii) at least one component which reduces the aqueous alkaline developer solubility of the developer soluble polymer (e.g. novolak), wherein said reduction in solubility is reversed upon the application of heat ("insolubilizer"), and
  (iii) optionally an IR absorber (i.e. a compound which absorbs IR radiation and converts it to heat),
wherein components (i) and (ii) do not have to be present as separate substances but can be used in the form of an accordingly functionalized novolak. It is also possible to use an IR absorber that also acts as insolubilizer. Such single-layer IR-sensitive positive working elements are for example described in EP 825 927 B1.

Polymers with hydroxyl, carboxylic acid, amino, amide and maleimide groups can for example be used as polymers soluble in aqueous alkaline developer. In particular, these compounds include phenolic resins, copolymers of 4-hydroxystyrene and 3-Methyl-4-hydroxystyrene or 4-methoxystyrene, copolymers of (meth)acrylic acid and styrene, copolymers of maleimides and styrene, hydroxy- or carboxy-functionalized celluloses, copolymers of maleic acid anhydride and styrene and partially hydrolyzed polymers of maleic acid anhydride. Phenolic acids, in particular novolak, are especially preferred.

Suitable novolak resins are condensation products of phenols, e.g. phenol itself, C-alkyl-substituted phenols (including cresols, xylenols, p-tert-butylphenol, p-phenylphenol and nonyl phenols) and diphenols (e.g. bisphenol-A), with suitable aldehydes such as formaldehyde, acetaldehyde, propionaldehyde, and furfuraldehyde. The type of catalyst and the molar ratio of the reactants determine the molecular structure and thus the physical properties of the resin. An aldehyde/phenol ratio of about 0.5:1 to 1:1, preferably 0.5:1 to 0.8:1, and an acid catalyst are used in order to produce those phenolic resins known as "novolaks" and having a thermoplastic character. However, as used in the present application, the term "novolak resin" should also encompass the phenolic resins known as "resols" which are obtained at higher aldehyde/phenol ratios and in the presence of alkaline catalysts.

Based on the dry layer weight, the novolak resin is preferably present in an amount of at least 40 wt-%, more preferred at least 50 wt-%, even more preferred at least 70 wt-% and particularly preferred at least 80 wt-%. Usually, the amount does not exceed 95 wt-%, more preferred 85 wt-%.

The chemical structure of the IR absorber is not particularly restricted as long as it is capable of converting the absorbed radiation into heat. The IR absorbers mentioned above in connection with photopolymerizable IR-sensitive elements can be used. The IR absorber is preferably present in an amount of at least 0.1 wt-% based on the dry layer weight, more preferred at least 1 wt-%, and particularly preferred at least 2 wt-%. Usually, the amount of IR absorber does not exceed 25 wt-%, more preferred 20 wt-% and particularly preferred 15 wt-%. Either a single IR absorber or a mixture of two or more can be present; in the latter case, the amounts given refer to the total amount of all IR absorbers.

The amount of IR absorber to be used also has to be considered in view of the dry layer thickness of the coating. It should preferably be selected such that the optical density of the coating—measured for example on a transparent polyester film—preferably shows values between 0.4 and 1.0 at the wavelength of the IR light with which the coating is irradiated.

The IR-sensitive coating furthermore comprises at least one substance that reduces the aqueous alkaline developer solubility of the polymer like novolak, whereby this reduction in solubility is reversed by the application of heat. In the following, this substance is briefly referred to as "insolubilizer". The insolubilizer may or may not be covalently bonded to a polymer.

Use can be made of insolubilizers already described in the prior art or of different ones.

Suitable insolubilizers include for example the compounds described in WO 98/42507 and EP-A 0 823 327 which are not photosensitive and comprise functional groups that can enter into a hydrogen bond with the phenolic OH groups of novolak resins. WO 98/42507 mentions sulfone, sulfoxide, thion, phosphinoxide, nitrile, imide, amide, thiol, ether, alcohol, urea, nitroso, azo, azoxy and nitro groups, halogens and in particular keto groups as suitable functional groups. Xanthone, flavanone, flavone, 2,3-diphenyl-1-indenone, pyrone, thiopyrone and 1'-(2'-acetonaphthonyl)benzoate are mentioned as examples of suitable compounds.

In WO 99/01795, polymers with specific functional groups Q which preferably do not comprise diazide groups, acid groups or acid-forming groups are used as insolubilizers, and according to a preferred embodiment, Q is selected from amino, monoalkylamino, dialkylamino, amido, monoalkylamido, dialkylamido groups, fluorine atoms, chlorine atoms, carbonyl, sulfinyl or sulfonyl groups. These polymeric insolubilizers can also be used in the present invention.

The insolubilizers described in WO 99/01796, in this case compounds with diazide units, can be used in the present invention as well.

Another group of insolubilizers suitable for use in the present invention is described in WO 97/39894. They are e.g. nitrogen-containing compounds wherein at least one nitrogen atom is quaternized and forms part of a heterocyclic ring; examples include e.g. quinolinium compounds, benzothiazolium compounds and pyridinium compounds, and in particular cationic trimethylmethane dyes such as Victoria Blue (C I Basic Blue 7), crystal violet (C I Basic Violet 3) and ethyl violet (C I Basic Violet 4). Furthermore, compounds with carbonyl function such as N-(4-bromobutyl)-phthalimide, benzophenone and phenanthrenequinone are mentioned. Compounds of the formula $Q_1\text{-}S(O)_n\text{-}Q_2$ (wherein $Q_1$=optionally substituted phenyl or alkyl group; n=0, 1 or 2; $Q_2$=halogen atom or alkoxy group), Acridine Orange Base and ferrocenium compounds can be used as well.

If the IR absorbers comprise the structural elements mentioned in WO 97/39894, they also function as insolubilizers.

The functionalized novolaks described in U.S. Pat. No. 6,320,018 B can be used in the heat-sensitive elements of the present invention as well. These novolaks contain substituents which allow a two- or four-center hydrogen bond (preferably a four-center hydrogen bond, also named quadrupol hydrogen bonding QHB) between the polymer molecules. This also decreases the aqueous alkaline developer solubility of the underlying novolak. Such hydrogen bonds are broken by heating and the original solubility of the novolak is restored. If such a functionalized novolak is used, it assumes the function of components (i) and (ii) of the heat-sensitive composition so that the additional use of a novolak without corresponding functional groups and/or an insolubilizer as described above is not necessary, but not excluded, either.

The functionalized novolaks comprise at least one covalently bonded unit and at least one non-covalently bonded unit, with the non-covalent bond being thermally unstable; these novolaks have a two- or four-center hydrogen bond at essentially every non-covalently bonded unit. A preferred group of such functionalized novolaks which can be used as novolak with a simultaneous insolubilizing function can be described with the following formula (XIV):

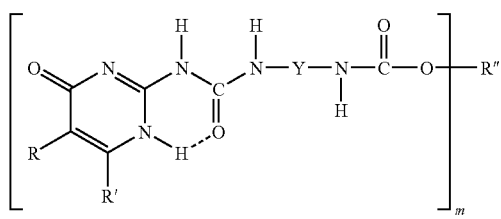
(XIV)

wherein R and R' are independently selected from a hydrogen atom and a cyclic or straight or branched saturated or unsaturated hydrocarbon group with preferably 1 to 22 carbon atoms (preferably hydrogen and $C_1$-$C_4$ alkyl), R" is a phenolic group derived from a novolak R"(OH)$_p$, Y is a divalent cyclic or straight or branched saturated or unsaturated hydrocarbon group with preferably 1 to 22 carbon atoms derived from a diisocyanate of the formula Y(NCO)$_2$ (e.g. isophorone diisocyanate, toluene-1,2-diisocyanate, 3-isocyanatomethyl-1-methylcyclo-hexylisocyanate), m is at least 1 and p is 1 or 2.

The preparation of functionalized novolaks of formula (XIV) can e.g. be inferred from US 2002/0,150,833 A1.

Another class of suitable functionalized resins, such as e.g. functionalized phenolic resins and in particular functionalized novolaks, is disclosed in U.S. Pat. No. 6,537,735 B. While the non-functionalized resin is soluble in aqueous alkaline developer, the functionalized resin is insoluble in the developer; however, the application of heat (for example generated by IR radiation) renders it soluble in the developer. Preferably, the non-functionalized resin comprises OH or SH groups which in the functionalized resin are at least partially converted to covalently bonded functional groups Q; preferably, the functional groups Q are formed via an esterification reaction of the OH groups and are preferably selected from —O—SO$_2$-tolyl, —O—dansyl, —O—SO$_2$-thienyl, —O—SO$_2$-naphthyl and —O—CO-phenyl. The ratio of functional groups Q to OH groups is preferably 1:100 to 1:2, more preferred 1:50 to 1:3. The novolak resins, resols, acrylic resins with phenolic side chains and hydroxystyrenes described above can for example be used as non-functionalized resins. An especially preferred functionalized resin of this class is a phenolic resin (preferably a novolak), partially (e.g. 10 to 20%) esterified with toluenesulfonic acid or sulfonic acid chloride; however, all the other functionalized resins described in U.S. Pat. No. 6,537,735 can be used in the present invention as well.

Although all the insolubilizers mentioned above can be used in the heat-sensitive coating of the present invention, the following are preferred: Cyanine dyes, triarylmethane dyes, quinolinium compounds, the above insolubilizers with (a) keto group(s) and the above insolubilizers with (a) sulfone group(s), as well as novolaks functionalized with substituents capable of forming four-center hydrogen bonds. The cyanine dyes, triarylmethane dyes, quinolinium compounds, ketones and sulfones can be used as low-molecular substances or bonded to a polymer.

A single insolubilizer or mixtures of two or more compounds can be used in the heat-sensitive elements of the present invention.

The amount of insolubilizer(s) is not particularly restricted as long as it reduces the aqueous alkaline developer solubility of the novolak. However, the solubility reduction has to take place to such an extent that when an aqueous alkaline developer is used, the heated areas of the coating are removed considerably faster than the non-heated areas.

Independently of whether the insolubilizer also functions as IR absorber, it is preferably present in an amount of at least 0.1 wt-% based on the dry layer weight, more preferred at least 0.5 wt-%, especially preferred at least 1 wt-% and particularly preferred at least 2 wt-%. Preferably, no more than 25 wt-%, more preferred no more than 15 wt-%, are used.

Optional binders are for instance polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331). The total amount of binders is preferably 1 to 99 wt-%, based on the dry layer weight, especially preferred 10 to 98 wt-%.

Dual-Layer Plates

IR sensitive elements processed according to the present invention can also be positive working dual-layer elements wherein a first layer is provided on the hydrophilic surface of the substrate which is soluble in aqueous alkaline developer and a top layer ("masking layer") on top of the first layer which is not dispersible or soluble in and not penetrable by an aqueous alkaline developer, and which is rendered soluble or dispersible in or penetrable by the developer by IR irradiation.

Suitable binders for the first ("lower") layer of such dual-layer positive working IR-sensitive elements are for instance polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331). The binders are preferably present in an amount of 5 to 99 wt-%, based on the dry layer weight, especially preferred 10 to 98 wt-%.

An IR absorber ("photothermal conversion material") is present in the first layer, or the top layer or in both layers; it can also be present in a separate "absorber layer". Preferably the IR absorber is present in the first layer.

The chemical structure of the IR absorber is not particularly restricted as long as it is capable of converting the absorbed IR radiation into heat. The IR absorbers mentioned above in connection with photopolymerizable IR-sensitive elements can be used. The IR absorber is preferably present in an amount of at least 1 wt-% based on the dry layer weight of the layer in which it is present, more preferred at least 2 wt-%, and particularly preferred at least 5 wt-%. Usually, the amount of IR absorber does not exceed 35 wt-%, more preferred 30 wt-% and particularly preferred 25 wt-% of the layer in which it is present. If the IR absorber is only present in the first layer, its amount in said layer is preferably from 10 to 20 wt-%, based on the dry layer weight of the first layer. Either a single IR absorber or a mixture of two or more can be present; in the latter case, the amounts given refer to the total amount of all IR absorbers present in one layer.

The top layer protects the first layer from being dissolved by an aqueous alkaline developer. It is therefore necessary that the top layer itself is not soluble or dispersible in or penetrable by an aqueous alkaline developer. By the wording "not soluble in, dispersible in or penetrable by an aqueous alkaline developer", it is meant that the top layer can resist the attack of an aqueous alkaline developer having a pH of at least 8 for at least 2 minutes. However, upon exposure to IR radiation the top layer becomes removable by an aqueous alkaline developer (necessary dwell time: less than 2 minutes).

Various dual-layer plates are known in the art, however, the mechanisms of change of solubility/dispersibility/penetrability due to exposure to IR radiation are still not fully understood. Such dual-layer systems are for instance described in U.S. Pat. No. 6,352,812, U.S. Pat. No. 6,352,811, U.S. Pat. No. 6,358,669, US 2002/0,150,833 A1, U.S. Pat. No. 6,320,018, U.S. Pat. No. 6,537,735 and WO 02/14071, In principle, the following types of top layers are known:
a) The top layer comprises a polymer like a novolak which itself is soluble/dispersible in an aqueous alkaline developer and an "insolubilizer" which reduces the solubility/dispersibility to such a high degree that the layer is not soluble or penetrable under developing conditions. The interaction between the polymer and the inhibitor is deemed to be weakened by IR radiation to such a degree that the irradiated (heated) areas of the layer are rendered soluble/dispersible in or penetrable by the developer. Such systems are for example described in U.S. Pat. No. 6,352,811 and U.S. Pat. No. 6,358,669. The polymer/insolubilizer systems can be the same as those described above for single layer plates.
(b) The top layer comprises a polymer like a novolak which as such is soluble/dispersible in an aqueous alkaline developer but which has been chemically modified (for instance by chemically binding an "insolubilizer") so that it is not soluble/dispersible/penetrable by an aqueous alkaline developer. Such functionalized resins (like e.g. functionalized novolaks) are for instance described in US 2002/0,150,833 A1, U.S. Pat. No. 6,320,018 B and U.S. Pat. No. 6,537,735 B.

The top layer can also comprise a polymer which is not soluble/dispersible in an aqueous alkaline developer at usual developing conditions (i.e. the top layer can resist the attack of a developer for at least 2 minutes).

It is assumed that either there are any interactions within the top layer which are weakened by IR radiation or microcracks and/or bubbles are formed in the top layer or in the interface between first layer and top layer due to exposure to IR radiation (and the heat created thereby) which allows removal of the initially insoluble/inpenetrable top layer together with the soluble bottom layer by the developer in the exposed areas.

Polymers and copolymers with phenolic OH groups, i.e. phenolic resins, are preferably used for a top layer of the type (a) as described above. Suitable phenolic resins include e.g. novolaks, resols, acrylic resins with phenolic side chains and polyvinyl phenolic resins, whereby novolaks are especially preferred.

Novolak resins suitable for the present invention are condensation products of suitable phenols, e.g. phenol itself, C-alkyl-substituted phenols (including cresols, xylenols, p-tert-butylphenol, p-phenylphenol and nonylphenols), and of diphenols (e.g. bisphenol-A), with suitable aldehydes such as formaldehyde, acetaldehyde, propionaldehyde and furfuraldehyde. The type of catalyst and the molar ratio of the reactants determine the molecular structure and thus the physical properties of the resin. An aldehyde/phenol ratio of about 0.5:1 to 1:1, preferably 0.5:1 to 0.8:1, and an acid catalyst are used in order to produce those phenolic resins known as "novolaks" which have a thermoplastic character. As used in the present application, however, the term "novolak resin" should also encompass the phenolic resins known as "resols" which are obtained at higher aldehyde/phenol ratios and in the presence of alkaline catalysts.

The amount of insolubilizer(s) in a top layer of type (a) above is not particularly restricted as long as it reduces the aqueous alkaline developer solubility of the novolak. However, the solubility reduction has to take place to such an extent that when an aqueous alkaline developer is used, the heated areas of the coating are removed considerably faster than the non-heated areas.

The insolubilizer is preferably present in an amount of at least 0.1 wt-% based on the dry layer weight, more preferred at least 0.5 wt-%, especially preferred at least 2 wt-% and particularly preferred at least 5 wt-%. Preferably, no more than 40 wt-%, more preferred no more than 25 wt-%, are used.

Polymers useful for a top layer of type (b) are for instance functionalized novolaks like those of formula (XII) mentioned above and functionalized phenolic resins like those mentioned in U.S. Pat. No. 6,537,735 B (e.g. tosylated novolaks), see also above under the headline "Single-layer plates". Modified alkylphenol resins (like those commercially available from Schenectady under the trade name SP1077 and HRJ302) as well as novolaks based on xylenol and cresol (like those commercially available from AZ-Electronics under the trade name SPN-572) are also useful for a top layer of type (b).

Optional Components

Independently of whether the element is UV/VIS- or IR-sensitive, the radiation-sensitive coating can comprise one or more of the following optional components in addition to the essential components. If the coating consists of several layers, the optional component(s) can be present in one, several or all of the layers. Dyes or pigments having a high absorption in the visible spectral range can be present in order to increase the contrast ("contrast dyes and pigments"). Particularly suitable dyes and pigments are those that dissolve well in the solvent or solvent mixture used for coating or are easily introduced in the disperse form of a pigment. Suitable contrast dyes include inter alia rhodamine dyes, triarylmethane dyes such as Victoria blue R and Victoria blue BO, crystal violet and methyl violet, anthraquinone pigments, azo pigments and phthalocyanine dyes and/or pigments. The colorants are preferably present in an amount of 0 to 15 wt-%, more preferred 0.5 to 10 wt-%, particularly preferred 1.5 to 7 wt-%, based on the dry layer weight.

Furthermore, the layer(s) can comprise surfactants (e.g. anionic, cationic, amphoteric or non-ionic tensides or mixtures thereof). Suitable examples include fluorine-containing polymers, polymers with ethylene oxide and/or propylene oxide groups, sorbitol-tri-stearate and alkyl-di-(aminoethyl)-glycines. They are preferably present in an amount of 0 to 10 wt-%, based on the dry layer weight, especially preferred 0.2 to 5 wt-%.

The layer(s) can furthermore comprise print-out dyes such as crystal violet lactone or photochromic dyes (e.g. spiropyrans etc.). They are preferably present in an amount of 0 to 15 wt-%, based on the dry layer weight, especially preferred 0.5 to 5 wt-%.

Also, flow improvers can be present in the layer(s), such as poly(glycol)ether-modified siloxanes; they are preferably present in an amount of 0 to 1 wt-%, based on the dry layer weight.

The layer(s) can furthermore comprise antioxidants such as e.g. mercapto compounds (2-mercaptobenzimidazole, 2-mercaptobenzthiazole, 2-mercaptobenzoxazole and 3-mercapto-1,2,4-triazole), and triphenylphosphate. They are preferably used in an amount of 0 to 15 wt-%, based on the dry layer weight, especially preferred 0.5 to 5 wt-%.

Overcoat

An oxygen-impermeable overcoat can be applied over the photopolymerizable coating; "oxygen-impermeable" does not necessarily mean "impermeable to 100%" but sufficient for protecting the coating from atmospheric oxygen during storage, exposure and in particular during the time between exposure and further processing. During that time the overcoat has to exhibit sufficient adhesion to the light-sensitive coating so that safe handling (manufacture, packing, transport, exposure etc.) is guaranteed without tearing of the layers. In addition to its function as oxygen barrier layer the overcoat also protects the photopolymerizable coating from fingerprints and mechanical damage like scratches.

A number of water-soluble polymers are described in the literature as being suitable for such overcoats. Suitable examples are polyvinyl alcohol, partly saponified polyvinyl acetate which can also contain vinylether and vinylacetal units, polyvinyl pyrrolidone and copolymers thereof with vinyl acetate and vinyl ethers, hydroxy alkyl cellulose, gelatin, polyacrylic acid, gum arabic, polyacryl amide, dextrin, cyclodextrin, copolymers of alkylvinyl ethers and maleic acid anhydride as well as water-soluble high molecular polymers of ethylene oxide having molecular weights of above 5,000 are particularly suitable. Polyvinyl alcohol is a preferred overcoat polymer. Also polyvinyl alcohol in combination with poly(1-vinylimidazole) or a copolymer of 1-vinyl-imidazole and at least one further monomer as described in WO 99/06890 can be used.

Polyvinyl alcohol can also be used in combination with polyvinyl pyrrolidone as adhesive.

Overcoats are also described in U.S. Pat. No. 3,458,311, U.S. Pat. No. 4,072,527, U.S. Pat. No. 4,072,528, EP 275 147 A1, EP 403 096 A1, EP 354 475 A1, EP 465 034 A1 and EP 352 630 A1.

In a preferred embodiment the overcoat comprises polyvinyl alcohol or polyvinyl alcohol in combination with poly(1-vinylimidazol) (or a copolymer thereof).

Suitable polyvinyl alcohols are commercially available at inexpensive prices. They usually have a residual content of acetate groups in the range of 0.1 to 30 wt-%. Especially preferred are polyvinyl alcohols obtained from polyvinylacetate with a residual acetate content of 1.5 to 22 wt-%. By means of the molecular weight of the used polyvinyl alcohols, adhesion and water-solubility of the overcoats can be controlled. A lower molecular weight promotes the removal of the overcoat with aqueous solutions.

The water-soluble overcoats can be applied by means of surface coating methods known to the skilled practician such as doctor blade coating, roller coating, slot coating, curtain coating, spray or dipping processes. Dry layer weights of from 0.05 to 10 $g/m^2$, more preferably 0.2 to 3 $g/m^2$, most preferably 0.3 to 1 $g/m^2$ are suitable.

In many cases it is favorable to apply the water-soluble overcoats in an aqueous solution. This has the least detrimental effects on the environment and the human body.

For some applications, however, it can also be favorable to use organic solvents. In some substrates the addition of 0.5 to 60 wt-% of an organic solvent to the aqueous coating solution improves adhesion. By means of a slight solvation of the surface to be overcoated, the adhesive effect of the polymers of the overcoats according to the present invention is increased further. Such additives to solvents can e.g. be alcohols or ketones.

For a uniform and rapid wetting of the surface to be coated, anionic, cationic or non-ionic wetting agents may be added to the coating solutions. The overcoat furthermore can comprise stabilizers, preservatives, dyeing agents, foam separators and rheological additives.

Imagewise Exposure

If the absorber component used in the photopolymerizable coating absorbs UV/VIS radiation, the precursors are imagewise exposed in a manner known to the person skilled in the art with UV/VIS radiation of a wavelength of 250 to 750 nm. For this purpose, common lamps, such as carbon arc lamps, mercury lamps, xenon lamps and metal halide lamps, or lasers or laser diodes can be used. UV laser diodes emitting UV radiation in the range of about 405 nm (e.g. 405±10 nm), argon ion lasers emitting in the visible range (488 nm or 514 nm) and frequency-doubled fd:Nd:YAG lasers emitting at around 532 nm are of particular interest as a radiation source. The laser radiation can be digitally controlled via a computer, i.e. it can be turned on or off so that an imagewise exposure of the plates can be effected via stored digitized information in the computer; this way, so-called computer-to-plate (ctp) printing plates can be obtained.

If the absorber component absorbs IR radiation, i.e. noticeably absorbs radiation of a wavelength in the range of more than 750 to 1,200 nm, and preferably shows an absorption maximum in this range in its absorption spectrum, imagewise exposure can be carried out with IR radiation sources. Suitable radiation sources are e.g. semi-conductor lasers or laser diodes which emit in the range of 750 to 1200 nm, for example Nd:YAG lasers (1,064 nm), laser diodes which emit between 790 and 990 nm, and Ti:sapphire lasers. The laser radiation can be digitally controlled via a computer, i.e. it can be turned on or off so that an imagewise exposure of the plates can be effected via stored digitized information in the computer; this way, so-called computer-to-plate (ctp) printing plates can be obtained. Any image-setters equipped with IR lasers that are known to the person skilled in the art can be used.

The imagewise exposed precuror comprises exposed and unexposed areas of the coating.

Processing of the Exposed Precursor

After imagewise exposure the precursor is treated with the developer in order to remove the coating in the non-image areas thereby revealing the substrate in said areas; if the precursor was a positive working one, the non-image areas correspond to the exposed areas while for negative working precursors the non-image areas correspond to the unexposed areas. According to one embodiment a preheat step is carried out between exposure and treating with the developer.

If the precursor comprises an overcoat which protects the radiation sensitive coating, the overcoat can be removed by washing/rinsing with water before applying the developer. According to one embodiment the overcoat is not removed in a separate step but is removed together with the non-image areas of the radiation sensitive coating in a single step by treating the exposed precursor with the developer according to the present invention.

After removing the non-image areas of the coating (and optionally the overcoat) with the developer, the treated precursor can be dried.

According to one embodiment treating an exposed precursor with the developer according to the present invention results in (1) removing of the overcoat in the exposed and unexposed areas (if an overcoat is present at all or was not removed before the treatment with the developer), (2) removing of the non-image areas of the radiation sensitive coating, and (3) providing of a protective gumming in one single step.

According to another embodiment after removing the non-image areas of the coating (and optionally the overcoat) with the developer, the treated precursor can be rinsed with water.

According to a further embodiment after removing the non-image areas of the coating (and optionally the overcoat) with the developer and rinsing the precursor with water it is possible to apply a hydrophilic finishing gum.

Typically, the exposed precursor is contacted with the developer by rubbing or wiping the imageable layer with an applicator containing this liquid. Alternatively, the exposed precursor may be brushed with the developer or the developer may be applied to the precursor by spraying. The treatment with the developer can also be carried out by immersing the exposed precursor in a bath of the developer. According to one embodiment, the processing may be carried out in a commercially available processor, such as TDP 60 (Horsell) which contains only one bath for the developer and a drying section. Additionally, a conductivity-measuring unit can be incorporated into the processor.

According to another embodiment, conventional processors equipped with an immersion type developing bath, a section for rinsing with water, a gumming section, and a drying section, can be used. Additionally, a conductivity-measuring unit can be incorporated into the processor for controlling the developer activity of the developer.

The exposed precursor is typically treated with the developer at a temperature of 18° C. to about 28° C., for a period of about 5 seconds to about 60 seconds.

After a certain number of exposed precursors have been processed, the developing activity (for instance measured by titration or conductivity measurement) of a developer bath falls below a predetermined level. Then fresh developer is added to the bath (also called "top-up" process). Usually about 20 mL to about 200 mL, typically about 30-120 mL, of fresh developer per 1 $m^2$ of precursor processed is necessary to keep both the volume of developer and its activity/conductivity value constant. The processed lithographic printing plate, comprises regions in which imageable layer has been removed revealing the underlying surface of the hydrophilic substrate, and complimentary regions in which the imageable layer has not been removed. The regions in which the imageable layer has not been removed are ink receptive.

Instead of adding fresh developer for keeping the activity of the developer bath constant a replenisher can be added. The replenisher suitably differs from the fresh developer in that the concentration of the alkaline reagent is higher compared to the concentration of the alkaline reagent in the fresh developer used; the concentration of the other components might be the same or higher as in the fresh developer.

After having contacted the precursor with the developer any excess of said developer remaining on the precursor is removed (for instance by means of squeeze rollers; washing/rinsing the precursor with a liquid like water etc. After a subsequent optional drying step the processed precursor can be transferred to the press. On the press the processed precursor is contacted with fountain solution and printing ink, either simultaneously or subsequently (in any order, but preferably first fountain solution and thereafter ink). By contacting the precursor with the fountain solution and ink and thereafter with paper any remainders of undesired coating (radiation-sensitive coating in the non-image areas and/or overcoat) which have not already been removed by the treatment with the developer are removed.

Developer

The developer used in the method of the present invention is an aqueous solution having a pH value of >6, preferably a pH of from 7.5 to 13.5, more preferably a pH of from 10 to 13.5.

Water

Tap water, deionized water or distilled water can be used. The amount of water is preferably in the range of 45 to 98 wt-%, based on the total weight of the developer, especially preferred 50 to 95 wt-% and particularly preferred 80 to 95 wt-%.

Hydrophilic Polymer

The hydrophilic polymer used in the developer according to the present invention comprises
(m1) primary, secondary and/or tertiary amino groups, and
(m2) acid groups selected from —COOH, —$SO_3H$, —$PO_2H_2$ and $PO_3H_2$, and
(m3) optionally alkylene oxide units —$(CHR^1$—$CH_2$—$O)_p$—, wherein each $R^1$ independently represents H or —$CH_3$ and p is an integer from 1 to 50.

The acidic functional groups present in the hydrophilic polymer can all be in the form of a free acid, or all of said groups are in the form of a salt, or a part thereof is in the form of a free acid and the remaining part is in the form of a salt. When reference is made to the acidic functional group(s) in connection with the hydrophilic polymer this should include free acidic groups, salts and mixtures thereof unless defined otherwise.

It is essential for the hydrophilic polymer that it comprises both amino groups and acid groups.

Optionally the hydrophilic polymer comprises (m3) alkylene oxide units —$(CHR^1$—$CH_2$—$O)_p$— wherein each $R^1$ independently represents H or —$CH_3$ and p is an integer from 1 to 50. The alkylene oxide units can be present in the polymer backbone or in side chains. According to one embodiment the alkylene oxide units are present in side chains as spacer between the backbone and the acid groups and/or amino groups.

The acid groups are selected from —COOH, —$SO_3H$, —$PO_2H_2$ and —$PO_3H_2$; the preferred acid group is —COOH. Mixtures of different acid groups within one polymer molecule are also possible.

It is also possible to introduce ester groups as long as the hydrophilic polymer has the capability to hydrophilize the substrate in the no-image areas to avoid toning on press. One representative example are sulfobetaines, that is [2-(methacryloyloxy)-ethyl]-dimethyl-(3-sulfopropyl)-ammonium hydroxide One polymer molecule can comprise primary, secondary or tertiary amino groups. It is also within the scope of the present invention that one polymer molecule comprises a mixture of primary and secondary amino groups, primary and tertiary amino groups, secondary and tertiary amino groups or a mixture of primary and secondary and tertiary amino groups. In addition, also amino groups with quaternized nitrogen atom are possible; in such a case, suitable counter anions like are required. There are lots of anions possible as long as the substrate surface of the no-image areas maintains its hydrophilicity. Preferred anions are halides, phosphates, phosphonates, sulfates, tetrafluoro borates, hexafluorophosphates and others. In case that half esters with organic acids are used it is recommended to chose such a chain length that the anions does not become too hydrophobic.

According to one embodiment, the amino groups are bound to the polymer backbone either directly or via a spacer; suitable spacers are for instance $C_1$-$C_4$ alkylene groups. It is preferred within this embodiment that the amino groups are directly bound to a carbon atom of the polymer backbone; according to one embodiment, the hydrophilic polymer comprises structural units with amino groups represented by the following formula

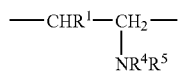

wherein $R^1$ is H or $CH_3$ and $R^4$ and $R^5$ are independently selected from H, alkyl, aryl, and alkylaryl. The nature of the substituent is chosen in such a way that the hydrophilicity of the polymer is high enough for efficient hydrophilization of the no-image areas that in order to avoid toning on press. A good guess for incorporation of appropriate groups is the solubility parameter, which is described in more detail in D. W. van Krevelen, "Properties of Polymers: Their Correlation with Chemical Structure; Their Numerical Estimation and Prediction From Additive Group Contributions", Elsevier, 2003, $3^{rd}$ Edition, ISBN 044482877X.

The hydrophilic polymer used in the present invention should have a sufficiently high hydrophilicity to avoid toning of the printing plate. One possibility of defining the hydrophilicity is to calculate the solubility parameter δ, which is a quantity defining the solubility of component A in component B. A may be the polymer while B is the solvent. This is well reviewed and explained in D. W. van Krevelen, Properties of Polymers, Elsevier, $3^{rd}$ edition, Amsterdam, 2003.

According to the assumption of Hansen:

$$\delta_t^2 = \delta_d^2 + \delta_p^2 + \delta_h^2$$

wherein
t=total
d=dispersed forces
p=polar forces
h=hydrogen bonding

According to the method of Hoftyzer and Van Krevelen $$\delta_d = \frac{\sum F_{di}}{V_m}$$

$$\delta_p = \frac{\sqrt{\sum F_{pi}^2}}{V_m}$$

$$\delta_h = \frac{\sqrt{\sum E_{hi}}}{V_m}$$

wherein $F_{di}$ (in $J^{1/2} \cdot cm^{3/2} \cdot mol^{-1}$) are the group contributions to the dispersion component $F_d$ of the molar attraction constant, $F_{pi}$ (in $J^{1/2} \cdot cm^{3/2} \cdot mol^{-1}$) are the group contributions to the polar component $F_p$ of the molar attraction constant, $E_{hi}$ (in $J \cdot mol^{-1}$) is the hydrogen bonding energy per structural group, and $V_m$ (in $cm^3 \cdot mol^{-1}$) is the molar volume.

For the present invention it is considered sufficient to concentrate on $\delta_h$, which relates to the solubility in polar solvents and gives a certain measure for the hydrophilicity. The following table shows the hydrogen bonding energies $E_h$ for several groups. It is clear from this table that polar groups strongly contribute to $\delta_h$ while the incorporation of hydrophobic substituents has no impact on $\delta_h$ but only results in an overall change of δ. Thus, the appropriate incorporation of additional substituents with even hydrophobic properties can be done as long as the overall solubility parameter δ does not strongly decrease.

Within the present invention a polymer is considered hydrophil if its $\delta_h$ calculated as shown above is at least 10 $J^{0.5}/cm^{1.5}$.

| | $E_{hi}$ (in $J \cdot mol^{-1}$) |
|---|---|
| —$CH_3$ | 0 |
| —$CH_2$— | 0 |
| —CH— | 0 |
| —C— | 0 |
| =$CH_2$ | 0 |
| =CH | 0 |
| =C | 0 |
| -Cyclohexyl | 0 |
| -Phenyl | 0 |
| -Phenyl(o, mp) | 0 |
| —Cl | 400 |
| —CN | 2500 |
| —OH | 20000 |
| —O— | 3000 |
| —COH | 4500 |
| —CO— | 200 |
| —COOH | 10000 |
| —COO— | 7000 |
| —$NH_2$ | 8400 |
| —NH— | 3100 |
| —N— | 5000 |
| —$NO_2$ | 1500 |
| =$PO_4$— | 13000 |

According to another embodiment, the nitrogen atom of the amino groups is not part of a side chain but is part of the polymer backbone. Hydrophilic polymers of this embodiment can for instance comprise following structural units (A1) in the backbone:

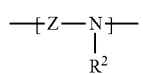

wherein Z is a straight chain or branched $C_1$-$C_3$ (preferably $C_1$-$C_2$) alkylene group and each $R^2$ independently represents H, $C_1$-$C_4$ alkyl, phenyl or —X-AG with each X being independently selected from divalent straight chain or branched saturated or unsaturated hydrocarbons (e.g. $C_2$-$C_6$ alkylene and arylene), alkylene oxide including polyalkylene oxide, and ethylene imine including polyethylene imine, and each -AG independently representing an acid group as defined above. If the amino group in (A1) is a terminal amino group, a second $R^2$ as defined above is present; it is also possible that an additional third $R^2$ is bound resulting in a quaternized nitrogen atom.

Spacer X is perferably a poly(alkylene)oxide or a poly(ethylene)imine.

If more than one unit (A1) is present in a polymer molecule, each Z and each $R^2$ is independently selected from the members given above.

According to one embodiment, the acid groups are bound to a carbon atom of the polymer backbone either directly or via a spacer; suitable spacers are for instance $C_1$-$C_4$ alkylene groups. For instance, the structural unit of the polymer comprising the acid group is represented by the following formula:

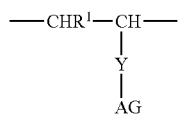

wherein $R^1$ is H or $CH_3$, Y is a single bond or a spacer, and AG is an acid group selected from —COOH, —$SO_3H$, —$PO_2H_2$ and —$PO_3H_2$, preferably —COOH.

Preferred spacer Y are alkyleneoxide, poly(alkylene)oxide, poly(ethylene)imine, ring opened lactones, ring opened lactames, ring opened anhydrides and carboxylic acids, and $C_xH_{2x}$ (x=1-6); especially preferred are poly(alkylene)oxide spacers.

According to another embodiment, the acid groups are bound to the nitrogen atoms of the amino groups via a spacer. It is especially preferred that in this case the nitrogen atom is part of the polymer backbone as shown in unit (A1) above and further exemplified in unit (A1'):

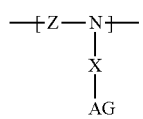

with Z, X and AG being as defined above.

The hydrophilic polymers can be prepared by polymerizing suitable monomers. For instance, monomers (c1) comprising one or more amino groups and monomers (c2) comprising one or more acid groups can be copolymerized resulting in hydrophilic polymers with acid groups and amino groups in side chains (i.e. acid and amino groups attached to the polymer backbone either directly or via a spacer). Suitable monomers with acid group are for instance acrylic acid, methacrylic acid, itaconic acid, crotonic acid, maleic acid anhydride ring opened with $C_1$ to $C_6$ alcohols, vinyl benzoic acid, vinylphosphonic acid, vinylsulfonic acid, vinylbenzenesulfonic acid, monoester of either hydroxyethyl methacrylate, hydroxyethyl acrylate or allylalcoholester of phosphoric acid, monoester of phosphoric acid with ethylene glycol methacrylate or ethylene glycol acrylate, monoester of phosphoric acid with polyethylene glycol methacrylate or ethylene glycol acrylate, sulfopropyl(meth)acryloylethyl dialkylammonium hydroxide.

Preferred examples for (c2) are either acrylic acid, methacrylic acid, vinylphosphonic acid, monoester of either hydroxyethyl(meth)acrylate or polyethyleneglycol (meth)acrylate with phosphoric acid, and (meth)acryloyldimethyl-(3-sulfopropyl)-ammonium hydroxide, maleinic acid, vinyl phosphonic acid, vinyl sulfuric acid.

Suitable monomers (c1) with amino group are for instance ethylene imin, propylene imine and vinyl amine.

Optionally, further comonomers (c3) like ethylene oxide, propylene oxide, lactones, lactames, vinyl alcohol, and vinyl methyl ether can be copolymerized with acid group containing monomers (c2) and amino group containing monomers (c1). In order to obtain a polymer with hydrophilic character which is preferably soluble in an aqueous solution having a pH of >6, the amount of such optional comonomers should be not more than 15 wt-% based on the total amount of monomers, preferably not more than 5 wt.-%.

Hydrophilic polymers with structural units (A1"), wherein X and AG are as defined above

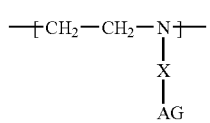

can be prepared by polymerizing vinyl amine or ethylene imine (optionally with other monomers) and subsequent Michael addition with an unsaturated monomer comprising an acid group selected from —COOH, —$SO_3H$, —$P_3O_2H_2$ and —$PO_3H_2$; instead of reaction with an unsaturated acid like (meth)acrylic acid, the obtained poly(ethylene)imine or poly(vinyl)amine homopolymer or copolymer thereof with an acrylate or methacrylate comonomer can be reacted with an halogenated acid like 2-chloro-acetic acid or intramolecular cyclic acid anhydrides like maleic acid anhydride.

The synthesis of phosphonic acid derivatives and sulfonic acid derivates of poly(ethylene imine) and poly(vinylamine) is for instance disclosed in EP 490 231 A2.

According to one embodiment the hydrophilic polymer is water-soluble.

In case of vinylamines, the molecular weight of the hydrophilic polymer can be adjusted by the well-known methods of the radical polymerization like polymerization the presence of chain transfer agents like alkyl mercapto compounds. Furthermore, by so called 'living and controlled' radical polymerization as described by K. Matyjaszewski et al. in J. Phys. Org. Chem. 8 (1995) pp. 306 to 315 allows a good control of molecular weight, polydispersity and terminal functionalities.

The hydrophilic polymer is generally present in an amount of at least 0.01 wt-% based on the total weight of the developer. The upper limit of the amount of the hydrophilic polymer will depend on the amount of hydrophobic groups in the polymer. However, while it could be higher, a practical upper limit is 15 wt-%.

The developer preferably contains 0.01 to 15 wt-% of the hydrophilic polymer, more preferred 0.1 to 5 wt-%, and most preferred 0.3 to 3 wt-%.

Alkaline Component

The developer used in the present invention optionally comprises an alkaline component.

The alkaline component can for instance be selected from alkali silicates, alkali hydroxides, $Na_3PO_4$, $K_3PO_4$, $NR_4OH$, wherein each R is independently selected from $C_1$-$C_4$ alkyl groups and $C_1$-$C_4$ hydroxyalkyl groups, amines and mixtures of 2 or more of the foregoing.

The amount of the alkaline component, or in case of mixtures the total amount of the alkaline components, is preferably selected such that the pH value of the developer is >6 to 14, preferably, the pH is in the range of 7.5 to 13.5, more preferably in the range of 10 to 13.5.

As used in the present invention, the term "alkali silicates" also encompasses metasilicates and water glasses. Sodium silicates and potassium silicates are preferred silicates. When alkali silicates are used, the amount of silicate is preferably at least 1 wt-% (calculated as $SiO_2$), based on the developer.

Of the alkali hydroxides, NaOH and KOH are especially preferred.

Usually the use of alkali metasilicates readily provides a pH value of more than 12 without further alkaline additives such as e.g. alkali hydroxide. When water glass is used, an alkali hydroxide is used in addition if a pH value of more than 12 is desired.

Preferred quaternary ammonium hydroxides $NR_4OH$ include for example tetramethyl ammonium hydroxide, trimethylethanol ammonium hydroxide, methyltriethanol ammonium hydroxide and mixtures thereof; an especially preferred ammonium hydroxide is tetramethyl ammonium hydroxide.

Suitable amines are primary, secondary and tertiary amines. Examples are mono- and dialkanol amines like monoethanol amine and diethanol amine.

Surfactant

A further optional component of the developer used in the present invention is the surfactant.

The surfactant is not specifically limited as long as it is compatible with the other components of the developer and soluble in aqueous alkaline solutions with a pH of >6. The surfactant can be a cationic, an anionic, an amphoteric or a nonionic one.

Examples of anionic surfactants include hydroxyalkanesulfonates, alkylsulfonates, dialkylsulfosuccinates, straight-chain alkylbenzenesulfonates, branched alkylbenzene-sulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, naphthalenesulfonateformalin condensates, sodium dodecylphenoxybenzene disulfonates, the sodium salts of alkylated naphthalenesulfonate, disodium methylene-di-naphtalene-disulfonate, sodium dodecyl-benzenesulfonate, (di)sulfonated alkyldiphenyloxides, ammonium or potassium perfluoroalkylsulfonates and sodium dioctyl-sulfosuccinate.

Particularly preferred among these anionic surfactants are alkylnaphthalenesulfonates, disulfonated alkyldiphenyloxides, and alkylsulfonates.

Suitable examples of the nonionic surfactants include polyoxyethylene alkyl ethers, polyoxyethylene phenyl ethers, polyoxyethylene 2-naphthyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene phenyl ethers and polyoxyethylene-2-naphthyl ethers.

Further, fluorine containing and silicone anionic and nonionic surfactants may be similarly used.

Amphoteric surfactants are for example N-alkylamino acid triethanol ammonium salts, cocamidopropyl betaines, cocamidoalkyl glycinates, sodium salt of a short chain alkylaminocarboxylate, N-2-hydroxyethyl-N-2-carboxyethyl fatty acid amidoethylamin sodium salts, and carboxcylic acid amidoetherpropionates; preferred are cocamido-propylbetaines.

Examples of cationic surfactants are tetraalkyl ammoniumchlorides like tetrabutyl ammoniumchloride and tetramethyl ammoniumchloride, and polypropoxylated quaternary ammonium chlorides.

Nonionic, anionic and amphoteric surfactants as well as mixtures thereof are preferred.

It is preferred that the developer used in the present invention comprises at least one member selected from surfactants and alkaline components.

Two or more of the above surfactants may be used in combination. The amount of the surfactant (or total amount of surfactants if more than one is used) is not specifically limited but is preferably from 0.01 to 20 wt-%, more preferably from 2 to 8 wt-% based on the total weight of the developer.

Water-Soluble Film Forming Hydrophilic Polymer

One optional component of the developer is a water-soluble film forming hydrophilic polymer.

Examples of suitable polymers are gum arabic, pullulan, cellulose derivatives such as hydroxymethyl celluloses, carboxymethylcelluloses, carboxyethylcelluloses or methylcelluloses, starch derivatives like (cyclo)dextrins, poly(vinyl alcohol), poly(vinyl pyrrolidone), polyhydroxy compounds like polysaccharides, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid and acrylamidopropane sulfonic acid, polyhydroxy compounds and starch derivatives.

Polyhydroxy compounds and starch derivatives are especially preferred. The starch derivative should be water-soluble, preferably cold-water-soluble and is selected from starch hydrolysis products such as dextrins and cyclodextrins, starch esters, such as phosphate esters and carbamate esters, starch ethers, such as e.g. cationic starch ethers and hydroxypropyl ethers, carboxymethyl starch and acetylated starch; from the above derivatives dextrins (including dextrin comprising sodium tetraborate and available as borax dextrin from Emsland Stärke GmbH) are preferred.

The starch used as a starting product for the starch derivatives can be of various origins, it can e.g. be obtained from corn, potatoes, rye, wheat, rice, manioc, tapioca, chestnuts or acorns; corn starch and potato starch are preferred.

Suitable water-soluble polyhydroxy compounds can be represented by the following structure:

$R^1(CHOH)_nR^2$ in which n is 4 to 7; and either (i) $R^1$ is hydrogen, aryl, or $CH_2OH$; and $R^2$ is hydrogen, an alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon-carbon single bond.

In one group of polyhydroxy compounds, $R^1$ is hydrogen or $CH_2OH$ and $R^2$ is hydrogen. In a preferred group of these polyhydroxy compounds, n is 5 or 6. This group includes the sugar alcohols, compounds of the structure $H(CHOH)_nH$, which do not carry a free aldehyde or ketone group and do not show a reducing property. The sugar alcohols may be obtained from natural sources or prepared by hydrogenation of reducing sugars. Preferred sugar alcohols include mannitol, sorbitol, xylitol, ribitol, and arabitol. Other sugar alcohols include, for example, talitol, dulcitol, and allodulcitol.

In another group of polyhydroxy compounds, $R^1$ and $R^2$ together form a carbon-carbon single bond. Included are carbocyclic compounds of the structure: $(CHOH)_n$, in which n is 4 to 7. In a preferred group of these polyhydroxy compounds, n is 5 or 6, more preferably 6. There are nine possible stereoisomers of 1,2,3,4,5,6-hexahydroxycyclohexane, several of which are naturally occurring. A preferred polyhydroxy compound is meso-inosit (cis-1,2,3,5-trans-4,6-hexahydroxycyclohexane). meso-Inosit can be isolated from corn steep liquor.

In another group of polyhydroxy compounds, $R^1$ is hydrogen, aryl, or $CH_2OH$; and $R^2$ is an alkyl group having 1 to 4 carbon atoms, $CH_2OR^3$ in which $R^3$ is an alkyl group having 1 to 4 carbon atoms, $CH_2N(R^4R^5)$ in which $R^4$ and $R^5$ are each independently H or an alkyl group having 1 to 4 carbon atoms, or $CO_2H$.

In another group of polyhydroxy compounds, $R^1$ is hydrogen or $CH_2OH$; and $R^2$ is $CO_2H$. More preferably, $R^1$ is H and n is 4 or 5. This group includes polyhydroxy compounds of the structure $H(CHOH)_nCO_2H$, in which n is 4 or 5. Conceptually, these polyhydroxy compounds may be produced by oxidation of the corresponding hexose or pentose sugar, i.e., oxidation of the aldehyde group of a hexose sugar such as glucose, galactose, allose, mannose, etc., or oxidation of aldehyde of a pentose sugar such as arabinose, ribose, xylose, etc.

Particularly preferred polyhydroxy compounds are the sugar alcohols mentioned above, like sorbitol.

The amount of the film forming polymer is not specifically limited; preferably it is from 1 to 30 wt-% based on the total weight of the developer, more preferably from 5 to 20 wt-%.

Further Optional Components of the Developer

Besides the essential components and the above-cited optional components the developer used in the present invention may contain further additives like organic solvents, biocides, complexing agents, buffer substances, dyes, antifoaming agents, odorants, anticorrosive agents and radical inhibitors.

Antifoaming Agents:

Suitable antifoaming agents include e.g. the commercially available Silicone Antifoam Emulsion SE57 (Wacker), TRITON® CF32 (Rohm & Haas), AKYPO® LF (ethercarboxylic acid Chem Y), Agitan 190 (Münzing Chemie), TEGO® Foamese 825 (modified polysiloxane, TEGO Chemie Service GmbH, Germany). Silicone-based antifoaming agents are preferred. They are either dispersible or soluble in water. The amount of antifoaming agent in the developer is preferably 0 to 1 wt-%, based on the weight of the developer especially preferred 0.01 to 0.5 wt-%. One antifoaming agent or a mixture of two or more can be used.

Buffers:

Suitable buffer substances include e.g. tris(hydroxymethyl)-aminomethane (TRIS), hydrogen phosphates, glycine, 3-(cyclohexylamino)-propane sulfonic acid (CAPS), hydrogen carbonates, borates including borax, 2-amino-2-methyl-1-propanol (AMP), 3-(cyclohexylamino)-2-hydroxy-1-propane-sulfonic acid (CAPSO), and 2-(N-cyclohexylamino)ethan-sulfonic acid (CHES).

Biocides:

The biocides should be effective against bacteria, fungi and/or yeasts. Suitable biocides include e.g. N-methylol-chloroacetamide, benzoic acid, p-hydroxybenzoic acid esters, phenol or its derivatives, formalin, imidazol derivatives, isothiazolinone derivatives like 1,2-benzisothiazolin-3-on, benzotriazole derivatives, amidines, guanidine derivatives, quaternary ammonium salts, pyridine, quinoline derivatives, diazine, triazole derivatives, oxazole and oxazine derivatives and mixtures thereof. Their amount is not particularly restricted and preferably accounts for 0 to 10 wt-% in the developer, based on the total weight of the solution, especially preferred 0.1 to 1 wt-%. One biocide or a mixture of two or more can be used.

Complexing Agents:

Examples of suitable complexing agents include: Aminopolycarboxylic acid and salts thereof, such as ethylene diamine tetraacetic acid and potassium or sodium salts thereof, diethylene triamine pentaacetic acid and potassium or sodium salts thereof, triethylene tetramino-hexaacetic acid and potassium or sodium salts thereof, hydroxyethyl ethylene diamine triacetic acid and potassium or sodium salts thereof, nitrilotriacetic acid and potassium or sodium salts thereof, 1,2-diaminocyclohexane-tetraacetic acid and potassium or sodium salts thereof and 1,3-diamino-2-propanol-tetraacetic acid and potassium or sodium salts thereof, and an organophosphonic acid, phosphonoalkane tricarboxylic acid or salts thereof, such as 2-phosphonobutane-1,2,4-tricarboxylic acid and potassium or sodium salts thereof, phosphonobutane-2,3,4-tricarboxylic acid and potassium or sodium salts thereof, phosphonoethane-2,2,2-tricarboxylic acid and potassium or sodium salts thereof, aminotris-(methylene-phosphonic acid) and potassium or sodium salts thereof and sodium gluconate.

The complexing agents can be used individually or as a combination of two or more. Organic amine salts of the above-mentioned complexing agents can be used instead of the potassium or sodium salts thereof. The amount of complexing agent preferably accounts for 0 to 5 wt-% in the developer, based on the total weight of the solution, especially preferred 0.01 to 1 wt-%.

Solvents:

The developer may also comprise an organic solvent or a mixture of organic solvents. The developer is a single phase. Consequently, the organic solvent must be miscible with water, or at least soluble in the developer to the extent it is added to the developer, so that phase separation does not occur. The following solvents and mixtures of these solvents are suitable for use in the developer: the reaction products of phenol with ethylene oxide and propylene oxide, such as ethylene glycol phenyl ether; benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol. A single organic solvent or a mixture of organic solvents can be used. The organic solvent is typically present in the developer at a concentration of between about 0 wt-% to about 15 wt-%, based on the weight of the developer preferably between about 3 wt-% and about 5 wt-%, based on the weight of the developer.

"Sludge Inhibitors":

As described in detail in U.S. Pat. No. 6,383,717 B1 and U.S. Pat. No. 6,482,578 B2 sludge may be formed in a developer bath due to the build up of free-radical polymerizable material in the case of negative working precursors where imaging is based on free-radical polymerization in the coating of the precursor. Sludge formation may be prevented by the presence of at least one material selected from filter dyes and free-radical inhibitors in the developer. Filter dyes absorb ambient ultraviolet and visible radiation and reduce the amount absorbed by the radiation-sensitive initiator system present in the loaded developer. Free-radical inhibitors inhibit free-radical polymerization of the monomer in the loaded developer.

The absorption of the filter dye is matched to the absorption of the radiation-sensitive initiator system, furthermore the filter dye should be stable in the developer and should not undergo any chemical reaction or interaction with the components of the developer, or the radiation-sensitive layer.

The concentration of filter dye required to produce the stabilizing effect under daylight or similar conditions will depend on the number of factors; however, the concentration of the filter dye is preferably about 0 to 2 wt-%, based on the weight of the developer, preferably about 0.4% to 2 wt-%, based on the weight of the developer.

The filter dye must be sufficiently soluble in the developer that enough filter dye can be dissolved in the developer to absorb radiation in the region about 350 nm to about 650 nm region of the spectrum. Dyes substituted with one or more sulfonic acid groups will typically have sufficient solubility in the developer. Preferred dyes include yellowish, yellow, orange and red dyes substituted with sulfonic acid groups. Especially preferred are sulfonated azo dyes. Suitable dyes include, for example, metanil yellow (C.I. 13065) and other similar water-soluble azo dyes, such as, for example, methyl orange (C.I. 13025), tropaeoline O (C.I. 14270), tropaeoline OO (C.I. 13080), tartrazine (C.I. 19140); Oxonol Yellow K (Riedel-de-Haen); dyes of the acid yellow type, such as C.I. 13900, C.I. 14170, C.I. 18835, C.I. 18965, C.I. 18890, C.I. 18900, C.I. 18950 (polar yellow), C.I. 22910, and C.I. 25135; and dyes of the acid red type, such as C.I. 14710, C.I. 14900, C.I. 17045, C.I. 18050, C.I. 18070, and C.I. 22890. Other suitable dyes will be readily apparent to those skilled in the art. A single filter dye or a mixture of filter dyes can be used.

Suitable free-radical inhibitors, also known as polymer stabilizers or free-radical traps, are well known in the art of monomer and polymer stabilization.

Any material that is capable of reacting with free-radicals to form products that do not initiate polymerization of the monomer, that has the necessary solubility and stability in the developer, and that does not adversely affect the properties of either the developer or the printing plate can potentially be used. They include, for example: compounds containing quinone or hydroquinone moieties, especially benzoquinone and substituted benzoquinones, and hydroquinone and substituted hydroquinones, such as hydroquinone monomethyl ether (4-methoxyphenol), t-butylhydroquinone (4-t-butylphenol, TBHQ), and t-butyl hydroxyanisol (BHA); recorcinol, pyrrogallol, phosphate esters; and hindered phenols and bisphenols, such as 2,6-di-t-butyl-4-methylphenol (BHT), and 2,6-di-t-butyl-4-methoxyphenol, 2,4,6-tri-t-butylphenol; stable free-radicals, such as di-t-butyl nitroxide and 2,2,6,6-tetramethyl-4-pyridone nitroxide; nitro substituted aromatics; amino phenols; phenothiazine; and secondary diaryl amines such as substituted diphenyl amines, N,N'-diphenyl-p-phenylenediamine, and N-phenyl-naphthyl amine. Preferred radical inhibitors are quinones, hydroquinones, ethers of hydroquinones, and hindered phenols. More preferred are ethers of hydroquinones, especially ethers of hydroquinone and hindered phenols. Preferred compounds are hydroquinone monomethyl ether (4-methoxyphenol), 2,6-di-t-butyl-4-methylphenol, and 2,4,6-tri-t-butylphenol. A single free-radical inhibitor or a mixture of free-radical inhibitors can be used. The free-radical inhibitor or a mixture of free-radical inhibitors is typically present in the developer at a concentration of about 0 wt-% to about 3.0 wt-% based on the weight of the developer, preferably about 0.5 wt-% to about 1.5 w, based on the weight of the developer.

Anticorrosive Agents:

Examples of anticorrosive agents are phosphonic acids and their salts like hydroxyethyl phosphonic acid and its salts, amino trismethylene phosphonic acid and its salts, and diethylentriaminpentamethylene phosphonic acid and its salts; phosphates like trisodium phosphate; borates like borax; as well as glycerol and glycols having the formula

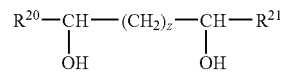

(wherein z is 0, 1 or 2 and $R^{20}$ and $R^{21}$ are independently hydrogen or $C_1$-$C_3$ alkyl).

The anticorrosive agent or mixture of such agents is typically present in the developer at a concentration of about 0 to 10 wt-% based on the weight of the developer, preferably 0.1 to 5 w, in case of glycerol or a glycol 5 to 10 w.

Further Additives:

Odorants and dyes can also be present in the developer, if desired. The dyes are added in order to prevent confusion at the users when different processing chemicals like developer and replenisher are used parallel at the same user. Examples for classes of dyes that can be used are azo dyes, triarylmethan dyes or phthalocyanines. The concentration of the dyes in the developer is typically 0.0005 to 0.5 wt.-%.

Odorants are used in order to compensate unpleasant smell of other components in the developer. The typical concentration of odorants is within 0.001 to 1 wt.-%.

The present invention is described in more details in the following examples; however they are not intended to restrict the invention in any way.

EXAMPLES

The following abbreviations are used:

Desmodur® N100 trifunctional isocyanate (biuret of hexamethylene diisocyanate), available from Bayer,
HEMA (2-hydroxyethyl)methacrylate
HEPi 2-(2-hydroxyethyl)-piperidine
HMDI hexamethylene diisocyanate
Joncryl 683 acrylic resin from SC Johnson & Son Inc. USA, acid number=162 mg KOH/g
IR dye 66e IR absorbing cyanine dye available from FEW Chemicals GmbH

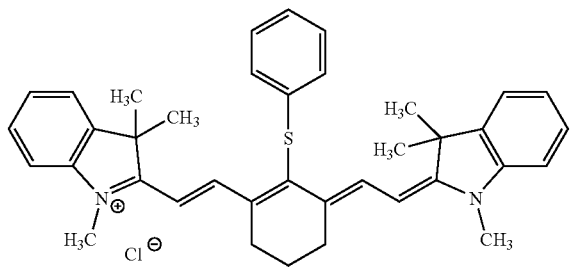 [SMILES: CN1/C(=C/C=C2\CCCC(/C=C/C3=[N+](C)c4ccccc4C3(C)C)=C2Sc2ccccc2)C(C)(C)c2ccccc21 ; [Cl-]]

IR absorbing cyanic dye available from FEW Chemicals GmbH ($\lambda_{max}$=820 nm)
Kayamer PM-2 ester of 1 mol phosphoric acid and 1.5 mol hydroxyethylmethacrylate, available from Nippon Kayaku
NK Ester BPE 500 ethoxylated Bisphenol A dimethacrylate (approximately 10 ethylene oxide units), available from Shin Nakamura Ltd.
NK Ester BPE-200 ethoxylated Bisphenol A dimethacrylate (approximately 4 ethylene oxide units), available from Shin Nakamura Ltd.
PC1199 nonionic surfactant (ethoxylated/propoxylated $C_{10}$-$C_{12}$ alcohol), available from Polygon Chemie AG
Renolblue B2G-HW® copper phthalocyanine pigment dispersed in polyvinyl butyral, available from Clariant
TEXAPON® CPS anionic surfactant (sodium octyl sulfate), available from Henkel
Amphotensid B5 amphoteric surfactant (cocamidopropyl betaine), available from Zschimmer & Schwarz GmbH
Surfynol® 465 nonionic surfactant (ethoxylated 2,4,7,9-tetramethyl-5-decyne-4,7-diol), available from Airproducts
Sorbidex 200 99% D-sorbitol, available from Ceresda
Akypo LF2 anionic surfactant, available from Kao Chemicals/JP
Emdex 30 AN 45 dextrine from potato starch, soluble in cold water, available from Emsland Starke GmbH
Pluriol P600 polypropylene glycol, $M_w$=600
Sequion 10 Na sodium salt of hydroxy-ethan-1,1-diphosphonic acid, available from Polygon Chemie AG
Sequion MS 84 carboxylic acid polymer, available from Polygon Chemie AG
Rewoteric AM-V sodium salt of N-β-hydroxyethyl-N-carboxymethyl-fatty acid amidoethylamine
Dehyton AB 30 lauryl dimethylaminoacetic betaine (40 wt-% aqueous solution from Cogris (amphoteric surfactant)
Reworyl NXS 40 sodium xylolsulfonate, available from REWO Chemical Group
Synperonic 304 T ethylene diamine alkoxylated with polypropylene acide/polyethylene oxide black copolymers, available from ICI Surfactants
Mikuni cyan copper Phthalocyanine pigment, 23 wt % in Dowanol PM
LUPASOL® PN60 polyethylene imine modified with acrylic acid and ethylene oxide, available from BASF
Blaunon B13 poly(oxyethylene)-2-naphthylether
PETRO AA methylnaphthalinsulfonat
Dowanol® PM propylene glycol methyl ether
Sobidex 240 D-Sorbit Examples 1-29 and Comparative Examples 1-7

An electrochemically roughened and anodized aluminum foil with an oxide weight of 2.5 g/m² was coated with a coating composition corresponding to Table 1 (combined with Tables 2 to 6) after filtering the solution. The sample was dried for 4 minutes at 90° C.

The obtained samples were overcoated with an aqueous solution of poly(vinyl alcohol) (Celvol 203 from Air Products, having a hydrolysis degree of 88%) to get a printing plate precursor having a dry coating weight after drying for 4 minutes at 90° C. as shown in Table 1.

TABLE 1

Plates for examples and comparative examples

| plate # | photopolymer layer | coating weight of the photopolymer layer | coating weight of the overcoat layer | exposure step | preheat step |
|---|---|---|---|---|---|
| 1 | Table 2 | 1.7 g/m² | 2.5 g/m² | 405 nm (30 mW) platesetter ANDROMEDA from Lithotech | 90° C. for 2 min |
| 2 | Table 3 | 1.7 g/m² | 2.0 g/m² | Trendsetter 3244 from Creo (830 nm, 40 to 90 mJ/cm²) | 90° C. for 2 min |
| 3 | Table 4 | 1.7 g/m² | 0.6 g/m² | Trendsetter 3244 from Creo (830 nm, 40 to 90 mJ/cm²) | — |
| 4 | Table 5 | 1.5 g/m² | 3 g/m² | 405 nm (30 mW) platesetter ANDROMEDA from Lithotech | — |
| 5 | Table 6 | 2.0 g/m² | 2.0 g/m² | Theimer vacuum frame equipped with Ga-doped Hg-lamp | 90° C. for 2 min |

TABLE 2

Composition of the photopolymer layer of plate # 1 sensitized to 405 nm

| | | |
|---|---|---|
| 6.48 | g | Copolymer of methyl methacrylate and methacrylic acid, dissolved in propylene glycol monomethyl ether resulting in a 27.9 wt % solution, showing an acid number of 85 |
| 1.12 | g | of a dispersion in propylene glycol monomethyl ether containing 7.25 wt % of copper phthalocyanine and 7.25 wt % of a polyvinylacetal binder containing 39.9 mol % vinyl alcohol, 1.2 mol % vinylacetate, 15.4 mol % acetal groups from acetaldehyde, 36.1 mol % acetal groups from butyraldehyde and 7.4 acetal groups from 4-formylbenzoic acid |
| 0.08 | g | Kayamer PM-2 |
| 10.98 | g | a solution of 30 weight % in methyl ethyl ketone of an oligomer made by reaction of HMDI + HEMA + HEPi |
| 0.6 | g | NK Ester BPE 500 |
| 1.12 | g | 2-phenyl-4-(2-chlorophenyl)-5-(4-diethylaminophenyl)-oxazole |
| 0.273 | g | 2,2-bis-(-2-chlorophenyl)-4,5,4',5'-tetraphenyl-2'H-[1,2']biimidazolyl |
| 0.497 | g | mercapto-3-triazol |
| 36 | ml | propylene glycol monomethyl ether |
| 24 | ml | Methanol |
| 29 | ml | methyl ethyl ketone |

TABLE 3

Composition of the photopolymer layer of plate # 2 sensitized to 810 . . . 830 nm

| | | |
|---|---|---|
| 4.26 | g | of a 30% propylene glycol mono methyl ether solution of a terpolymer prepared by polymerization of 470 parts by wt. styrene, 336 parts by wt. methyl methacrylate and 193 parts by wt. methacrylic acid |
| 1.26 | g | Joncryl 683 |
| 9 | g | a solution of 30 weight % in methyl ethyl ketone of an oligomer made by reaction of Desmodur ® N100 with 1 mol poly(propyleneglycol) methacrylate and 2 mol glycerole dimethacrylate |
| 0.10 | g | anilino diacetic acid |
| 0.30 | g | 2-(4-methoxyphenyl)4.6-trichlormethyl-1,3,5-triazin |
| 1.5 | g | pigment solution (MIKUNI cyan, 20 wt-%) |
| 0.021 | g | phosphoric acid (85%) |
| 0.09 | g | IR dye 66e |
| 0.33 | g | 5-(4-vinylbenzyl) thio-1,3,4-thiadiazole-2-thiol |
| 30 | ml | propylene glycol monomethyl ether |
| 3 | ml | Acetone |

TABLE 4

Composition of the photopolymer layer of plate # 3 (no-preheat type) sensitized to 810 . . . 830 nm

| | | |
|---|---|---|
| 2.92 | g | of a copolymer prepared by the reaction of 20 mol % methacrylic acid and 80 mol % allyl methacrylate |
| 3.93 | g | a solution of 30 weight % in methyl ethyl ketone of an oligomer made by reaction of Desmodur ® N100 with 1 mol poly(propyleneglycol) methacrylate and 2 mol glycerole dimethacrylate |
| 1.18 | g | NK Ester BPE-200 |
| 0.10 | g | anilino diacetic acid |
| 0.15 | g | 2-(4-methoxyphenyl)4.6-trichlormethyl-1,3,5-triazin |
| 1.5 | g | pigment solution (MIKUNI cyan, 20 wt-%) |
| 0.02 | g | phosphoric acid (85%) |
| 0.09 | g | IR dye 66e |
| 0.12 | g | 5-(4-vinylbenzyl) thio-1,3,4-thiadiazole-2-thiol |
| 0.18 | g | Kayamer PM-2 |
| 38 | ml | propylene glycol monomethyl ether |
| 4 | ml | 2-butanone |

TABLE 5

Composition of the photopolymer layer of plate # 4 (no-preheat type) sensitized to 405 nm

| | | |
|---|---|---|
| 1.62 | g | a copolymer of allyl methacrylate and methacrylic acid with an acid number of 55 |
| 0.28 | g | of a dispersion in propylene glycol mono methyl ether containing 7.25 wt % of copper phthalocyanine and 7.25 wt % of a polyvinylacetal binder containing 39.9 mol % vinyl alcohol, 1.2 mol % vinylacetate, 15.4 mol % acetal groups from acetaldehyde, 36.1 mol % acetal groups from butyraldehyde and 7.4 acetal groups from 4-formylbenzoic acid |
| 0.02 | g | Kayamer PM-2 |
| 0.2 | g | butyl-3-methyl-imidazolium tetrafluoroborat |
| 2.745 | g | of a 80% methyl ethyl ketone solution of an urethane acrylate prepared by reacting Desmodur ® N 100 ® (available from BAYER, Germany) comprising hydroxy ethyl acrylate and pentaerythritol triacrylate having a double-bond content of 0.5 double bonds/100 g when all isocyanate groups are completely reacted with the hydroxy group containing acrylates |
| 0.15 | g | NK Ester PBE-500 |
| 1.1 | g | 2-phenyl-4-(2-chlorophenyl)-5-(4.diethylaminophenyl)-oxazole |
| 0.27 | g | 2,2-bis-(-2-chlorophenyl)-4,5,4',5'-tetraphenyl-2'H-[1,2']biimidazolyl |
| 0.12 | g | 3-mercapto-1,2,4-triazol |
| 9 | g | propylene glycol monomethyl ether |
| 6 | g | Methanol |
| 7.25 | g | Butanone |

TABLE 6

Near UV sensitive photopolymer composition of plate # 5

| | |
|---|---|
| 2.1 g | of a terpolymer prepared by polymerization of 476 parts by wt. styrene, 476 parts by wt. methyl methacrylate and 106 parts by wt. methacrylic acid |
| 5.24 g | of a 80% methyl ethyl ketone solution of an urethane acrylate prepared by reacting Desmodur ® N 100 (available from BAYER, Germany) comprising hydroxyethyl acrylate and pentaerythritol triacrylate having a double-bond content of 0.5 double bonds/100 g when all isocyanate groups are completely reacted with the hydroxy group containing acrylates |
| 1.29 g | Dipentaerythritolpentaacrylate |
| 0.6 g | 2,4-trichloromethyl-6[(4-ethoxyethylenoxy)naphthyl]1,3,5-triazine |
| 0.16 g | 4,4'-N,N-diethylaminobenzophenone |
| 0.2 g | Benzophenone |
| 0.19 g | 3-mercapto-1,2,4-triazol |
| 0.12 g | Renolblue B2G-HW |
| 0.1 g | Leuco-crystal violet |

The samples were exposed as shown in Table 1.

Laser Exposure of Plates #2 and #3 at 830 nm:

The UGRA/FOGRA Postscript Strip version 2.0 EPS (available from UGRA), which contains different elements for evaluating the quality of the copies, was used for imaging plates #2 and #3 with Trendsetter 3244 from Creo (830 nm).

Photospeed of the plates exposed at 830 nm was evaluated by exposing the plate with different energies. Plate #2 was heated directly after exposure for 2 minutes to 90° C. The minimum energy having the lowest deviation of the target tonal values compared to the measured tonal value of the developed plate is defined as photospeed of the plate. The results are shown in Table 8.

Laser Exposure of Plates #1 and #4 at 405 nm:

Printing plates #1 and #4 were exposed with an imagesetter (Andromeda® A750M from Lithotech), equipped with a laser diode emitting at 405 nm (P=30 mW). An UGRA gray scale V2.4 with defined tonal values (all data were linearized in order to approximately obtain the desired tonal value) was exposed onto the plate precursors.

Plates #1 was heated directly after exposure for 2 minutes to 90° C. The sensitivity of the plate was determined using an UGRA Offset test scale 1982 with overall flood exposure using the platesetter disclosed above. The photospeed for such plates is defined as the energy needed in order to obtain two gray scale steps of an UGRA scale of the developed plate. The results are shown in Table 8.

Exposure of Plate #5 in a Vacuum Frame with a Ga-Doped Hg-Lamp:

Printing plate #5 was exposed with a Theimer vacuum frame equipped with a Ga-doped Hg-lamp in contact with UGRA Offset test scale 1982.

The plate was heated directly after exposure for 2 minutes to 90° C. The photospeed for the plates is defined as the energy needed in order to obtain two gray scale steps of an UGRA scale of the developed plate. The results are shown in Table 8.

Development of the Plates:

The plates were developed in a TDP 60 (Kodak Polychrome Graphics) single bath processor equipped with 2 scrub brush rollers with each of the processing liquids shown in Table 7.

The developing temperature was 22° C. and the developer soak time was 20 seconds. The plates were dried directly after development without further rinsing and gumming steps.

TABLE 7

Composition of the developers used

| Developer | Components | Composition |
|---|---|---|
| D1 | water | 77.99 wt-% |
| | Surfynol ® 465 | 5 wt-% |
| | sodium tri phosphate | 5 wt-% |
| | Sorbidex 200 | 10 wt-% |
| | anti-foam agent K900 | 0.01 wt-% |
| | LUPASOL ® PN 60 | 2 wt-% |
| | After mixing the pH was adjusted to 12 with a few drops of a 20 wt-% KOH solution | |
| D2a | water | 77.99 wt-% |
| | Surfynol ® 465 | 5 wt-% |
| | sodium tri phosphate | 5 wt-% |
| | dextrin (Emdex 30 AN 45) | 10 wt-% |
| | anti-foam agent K900 | 0.01 wt-% |
| | LUPASOL ® PN 60 | 2 wt-% |
| | After mixing the pH was adjusted to 12 with a few drops of a 30 wt-% KOH solution | |
| D2b | water | 77.99 wt-% |
| | Surfynol ® 465 | 5 wt-% |
| | sodium tri phosphate | 5 wt-% |
| | dextrin (Emdex 30 AN 45) | 10 wt-% |
| | anti-foam agent K900 | 0.01 wt-% |
| | LUPASOL ® PN 60 | 2 wt-% |
| | After mixing the pH was adjusted to 12 with a few drops of a 30 wt-% KOH solution | |
| D2c | water | 77.99 wt-% |
| | Surfynol ® 465 | 5 wt-% |
| | sodium tri phosphate | 5 wt-% |
| | dextrin (Emdex 30 AN 45) | 10 wt-% |
| | anti-foam agent K900 | 0.01 wt-% |
| | LUPASOL ® PN 60 | 2 wt-% |
| | After mixing the pH was adjusted to 12 with a few drops of a 30 wt-% KOH solution | |
| D2d | water | 77.99 wt-% |
| | Surfynol ® 465 | 5 wt-% |
| | sodium tri phosphate | 5 wt-% |
| | dextrin (Emdex 30 AN 45) | 10 wt-% |
| | anti-foam agent K900 | 0.01 wt-% |
| | LUPASOL ® PN 60 | 2 wt-% |
| | After mixing the pH was adjusted to 12 with a few drops of a 30 wt-% KOH solution | |

TABLE 7-continued

Composition of the developers used

| Developer | Components | Composition |
|---|---|---|
| D2e | water | 77.99 wt-% |
| | Surfynol ® 465 | 5 wt-% |
| | sodium tri phosphate | 5 wt-% |
| | dextrin (Emdex 30 AN 45) | 10 wt-% |
| | anti-foam agent K900 | 0.01 wt-% |
| | LUPASOL ® PN 60 | 2 wt-% |
| | After mixing the pH was adjusted to 12 with a few drops of a 30 wt-% KOH solution | |
| D3a | water | 92.84 wt-% |
| | potassium hydroxide solution (45 wt-%) | 0.16 wt-% |
| | PC1199 | 5 wt-% |
| | LUPASOL ® PN 60 | 2 wt-% |
| | After mixing the pH was adjusted to 12 with a few drops of a 30 wt-% KOH solution | |
| D3b | Water | 92.84 wt-% |
| | potassium hydroxide solution (45 wt-%) | 0.16 wt-% |
| | PC1199 | 5 wt-% |
| | LUPASOL ® PN 60 | 2 wt-% |
| | After mixing the pH was adjusted to 12 with a few drops of a 30 wt-% KOH solution | |
| D3c | water | 92.84 wt-% |
| | potassium hydroxide solution (45 wt-%) | 0.16 wt-% |
| | PC1199 | 5 wt-% |
| | LUPASOL ® PN 60 | 2 wt-% |
| | After mixing the pH was adjusted to 12 with a few drops of a 30 wt-% KOH solution | |
| D3d | water | 92.84 wt-% |
| | potassium hydroxide solution (45 wt-%) | 0.16 wt-% |
| | PC1199 | 5 wt-% |
| | LUPASOL ® PN 60 | 2 wt-% |
| | After mixing the pH was adjusted to 12 with a few drops of a 30 wt-% KOH solution | |
| D3e | water | 92.84 wt-% |
| | potassium hydroxide solution (45 wt-%) | 0.16 wt-% |
| | PC1199 | 5 wt-% |
| | LUPASOL ® PN 60 | 2 wt-% |
| | After mixing the pH was adjusted to 12 with a few drops of a 30 wt-% KOH solution | |
| D4a | water | 92.84 wt-% |
| | potassium hydroxide solution (45 wt-%) | 0.16 wt-% |
| | Blaunon B13 | 5 wt-% |
| | LUPASOL ® PN 60 | 2 wt-% |
| | After mixing the pH was adjusted to 12 with a few drops of a 30 wt-% KOH solution | |
| D4b | water | 92.84 wt-% |
| | potassium hydroxide solution (45 wt-%) | 0.16 wt-% |
| | Blaunon B13 | 5 wt-% |
| | LUPASOL ® PN 60 | 2 wt-% |
| | After mixing the pH was adjusted to 12 with a few drops of a 30 wt-% KOH solution | |
| D4c | water | 92.84 wt-% |
| | potassium hydroxide solution (45 wt-%) | 0.16 wt-% |
| | Blaunon B13 | 5 wt-% |
| | LUPASOL ® PN 60 | 2 wt-% |
| | After mixing the pH was adjusted to 12 with a few drops of a 30 wt-% KOH solution | |
| D4d | water | 92.84 wt-% |
| | potassium hydroxide solution (45 wt-%) | 0.16 wt-% |
| | Blaunon B13 | 5 wt-% |
| | LUPASOL ® PN 60 | 2 wt-% |
| | After mixing the pH was adjusted to 12 with a few drops of a 30 wt-% KOH solution | |
| D4e | water | 92.84 wt-% |
| | potassium hydroxide solution (45 wt-%) | 0.16 wt-% |
| | Blaunon B13 | 5 wt-% |
| | LUPASOL ® PN 60 | 2 wt-% |
| | After mixing the pH was adjusted to 12 with a few drops of a 30 wt-% KOH solution | |
| D5a | water | 92.8 wt-% |
| | Surfynol ® 465 | 2.5 wt-% |
| | Amphotensid B5 | 2.5 wt-% |
| | potassium hydroxide solution (45 wt-%) | 0.2 wt-% |
| | LUPASOL ® PN 60 | 2 wt-% |
| | After mixing the pH was adjusted to 12 with a few drops of a 30 wt-% KOH solution | |

TABLE 7-continued

Composition of the developers used

| Developer | Components | Composition |
|---|---|---|
| D5b | water | 92.8 wt-% |
| | Surfynol ® 465 | 2.5 wt-% |
| | Amphotensid B5 | 2.5 wt-% |
| | potassium hydroxide solution (45 wt-%) | 0.2 wt-% |
| | LUPASOL ® PN 60 | 2 wt-% |
| | After mixing the pH was adjusted to 12 with a few drops of a 30 wt-% KOH solution | |
| D5c | water | 92.8 wt-% |
| | Surfynol ® 465 | 2.5 wt-% |
| | Amphotensid B5 | 2.5 wt-% |
| | potassium hydroxide solution (45 wt-%) | 0.2 wt-% |
| | LUPASOL ® PN 60 | 2 wt-% |
| | After mixing the pH was adjusted to 12 with a few drops of a 30 wt-% KOH solution | |
| D5d | water | 92.8 wt-% |
| | Surfynol ® 465 | 2.5 wt-% |
| | Amphotensid B5 | 2.5 wt-% |
| | potassium hydroxide solution (45 wt-%) | 0.2 wt-% |
| | LUPASOL ® PN 60 | 2 wt-% |
| | After mixing the pH was adjusted to 12 with a few drops of a 30 wt-% KOH solution | |
| D5e | water | 92.8 wt-% |
| | Surfynol ® 465 | 2.5 wt-% |
| | Amphotensid B5 | 2.5 wt-% |
| | Potassium hydroxide solution (45 wt-%) | 0.2 wt-% |
| | LUPASOL ® PN 60 | 2 wt-% |
| | After mixing the pH was adjusted to 12 with a few drops of a 30 wt-% KOH solution | |
| D6 | water | 98 wt-% |
| | LUPASOL ® PN 60 | 2 wt-% |
| | pH = 6.5 | |
| D7 | water | 81.96 wt-% |
| | sodium metasilicate | 11.2 wt-% |
| | sodium silicate (37/40° Baume) | 2 wt-% |
| | Akypo LF2 (Kao Chemicals) (anionic surfactant) | 0.9 wt-% |
| | Dehyton AB30 (40 wt % aq. Solution; Cognis) (1-1) lauryl dimethylaminoacetic betaine(amphoteric surfactant) | 1.2 wt-% |
| | silicone-antifoam emulsion SE 57 (Wacker) | 0.04 wt-% |
| | LUPASOL ® PN 60 | 2.7 wt-% |
| | After mixing the pH was adjusted to 13.5 with a few drops of a 30 wt-% KOH solution | |
| D8 | water | 82.2 wt-% |
| | Hydropalat 3204 | 2.6 wt-% |
| | TEXAPON ® CPS | 5.3 wt-% |
| | PETRO AA | 1.2 wt-% |
| | diethanolamine | 1.2 wt-% |
| | 4-toluene sulfonic acid | 4.5 wt-% |
| | Dowanol ® PM | 1 wt-% |
| | LUPASOL ® PN 60 | 2 wt-% |
| | After mixing the pH was adjusted to 9.5 with a few drops of diethanol amine | |
| D9 | water | 71.65 wt-% |
| | sodium metasilicate × 5 H$_2$O | 10.14 wt-% |
| | trisodium phosphate × 12 H$_2$O | 1.91 wt-% |
| | sodium phosphate | 0.12 wt-% |
| | Sequion 10 Na | 0.19 wt-% |
| | Sequion MS 84 | 0.21 wt-% |
| | Pluriol P600 | 0.05 wt-% |
| | ethylene glycol | 7.48 wt-% |
| | glycerol | 5.34 wt-% |
| | LUPASOL ® PN 60 | 2.91 wt-% |
| | After mixing the pH was adjusted to 13.5 with a few drops of a 30 wt-% KOH solution | |
| D10 | water | 63.42 wt-% |
| | Sobidex 240 | 18.3 wt-% |
| | Reworyl NXS 40 | 2.1 wt-% |
| | potassium hydroxide (45 wt % solution) | 5.95 wt-% |
| | Synperonic 304 T | 8.39 wt-% |
| | LUPASOL ® PN 60 | 1.83 wt-% |
| | After mixing the pH was adjusted to 13.5 with a few drops of a 30 wt-% KOH solution | |
| D11 | water | 69.87 wt-% |
| | potassium hydroxide (45 wt % solution) | 13.39 wt-% |
| | phosphoric acid 85% in water | 2.6 wt-% |
| | potassium waterglass 42/43 degrees Be in water | 7.3 wt-% |
| | REWOTERIC AM-V | 0.23 wt-% |
| | Sequion 10 Na | 0.23 wt-% |
| | Pluriol P600 | 0.002 wt-% |
| | ethylene glycol | 4.37 wt-% |
| | LUPASOL ® PN 60 | 2 wt-% |
| | After mixing the pH was adjusted to 13.5 with a few drops of a 30 wt-% KOH solution | |
| CD1 | Water | 79.99 wt-% |
| | Surfynol ® 465 | 5 wt-% |
| | sodium tri phosphate | 5 wt-% |
| | Sorbidex 200 | 10 wt-% |
| | anti-foam agent K900 | 0.01 wt-% |
| | After mixing, the pH was adjusted to 12.5 with a few drops of a 30 wt-% KOH solution. | |
| CD2 | Water | 79.99 wt-% |
| | Surfynol ® 465 | 5 wt-% |
| | sodium tri phosphate | 5 wt-% |
| | Dextrin (Emdex 30 AN 45) | 10 wt-% |
| | anti-foam agent K900 | 0.01 wt-% |
| | After mixing, the pH was adjusted to 12.5 with a few drops of a 30 wt-% KOH solution. | |
| CD3 | Water | 94.84 wt-% |
| | potassium hydroxide solution (45 wt-%) | 0.16 wt-% |
| | PC1199 | 5 wt-% |
| | After mixing, the pH was adjusted to 12 with a few drops of a 30 wt-% KOH solution. | |
| CD4 | Water | 94.84 wt-% |
| | potassium hydroxide solution (45 wt-%) | 0.16 wt-% |
| | Blaunon B13 | 5 wt-% |
| | After mixing the pH was adjusted to 12 with a few drops of a 30 wt-% KOH solution | |
| CD5 | Water | 94.8 wt-% |
| | Surfynol ® 465 | 2.5 wt-% |
| | Amphotensid B5 | 2.5 wt-% |
| | potassium hydroxide solution (45 wt-%) | 0.2 wt-% |
| | After mixing the pH was adjusted to 12 with a few drops of a 30 wt-% KOH solution | |
| CD6 | Water | 84.55 wt-% |
| | sodium metasilicate | 11.26 wt-% |
| | sodium silicate (37/40° Baume) | 2.03 wt-% |
| | Akypo LF2 (Kao Chemicals) (anionic surfactant) | 0.92 wt-% |
| | Dehyton AB30 (40 wt % aq. Solution; Cognis) (1-1) lauryl dimethylaminoacetic betaine) (amphoteric surfactant) | 1.2 wt-% |
| | silicone-antifoam emulsion SE 57 (Wacker) | 0.04 wt-% |
| CD7 | Water | 84.2 wt-% |
| | Hydropalat 3204 | 2.6 wt-% |
| | TEXAPON ® CPS | 5.3 wt-% |
| | PETRO AA | 1.2 wt-% |
| | diethanolamine | 1.2 wt-% |
| | 4-toluene sulfonic acid | 4.5 wt-% |
| | Dowanol ® PM | 1 wt-% |
| | After mixing, the pH was adjusted to 10 with a few drops of a 30 wt-% KOH solution. | |
| CD8 | Water | 73.8 wt-% |
| | sodium metasilicate × 5 H$_2$O | 10.44 wt-% |
| | trisodium phosphate × 12 H$_2$O | 1.97 wt-% |
| | sodium phosphate | 0.12 wt-% |
| | Sequion 10 Na | 0.2 wt-% |
| | Sequion MS 84 | 0.22 wt-% |
| | Pluriol P600 | 0.05 wt-% |
| | ethylene glycol | 7.7 wt-% |
| | glycerol | 5.5 wt-% |

TABLE 7-continued

Composition of the developers used

| Developer | Components | Composition |
|---|---|---|
| CD9 | Water | 64.6 wt-% |
| | Sobidex 240 | 18.65 wt-% |
| | Reworyl NXS 40 | 2.14 wt-% |
| | potassium hydroxide (45 wt % solution) | 6.6 wt-% |
| | Synperonic 304 T | 8.55 wt-% |
| | After mixing, the pH was adjusted to 12.5 with a few drops of a 30 wt-% KOH solution. | |
| CD10 | Water | 71.3 wt-% |
| | potassium hydroxide (45 wt % solution) | 13.6777 wt-% |
| | phosphoric acid 85% in water | 2.65 wt-% |
| | potassium waterglass 42/43 degrees Be in water | 7.45 wt-% |
| | REWOTERIC AM-V | 0.23 wt-% |
| | Sequion 10 Na | 0.23 wt-% |
| | Pluriol P600 | 0.0023 wt-% |
| | ethylene glycol | 4.46 wt-% |
| | After mixing, the pH was adjusted to 13 with a few drops of a 30 wt-% KOH solution. | |

Printing with the Plates:

The thus prepared plates were loaded in a sheet-fed offset printing machine using abrasive ink (Offset S 7184 available from Sun Chemical which contains 10% of calcium carbonate). The image free areas were checked for toning. Up to 20 000 copies were made but, unless noted otherwise, the print run could have continued.

The following tests were carried out in order to check whether the use of developers D1-D11 results in any improvement compared to the comparative developers (CD1-CD10). The results of these tests are summarized in Table 8.

Evaluation of the Developing Speed:

For assessment of the developability unexposed plate stripes of 5×30 cm² were dipped into the corresponding developer being placed in a glass beaker and every 5 sec the stripes were lowered 4 cm deeper into the developer. Prior to this, plates #1, #2 and #5 were treated for 2 min in an oven at 90° C. After 50 sec the stripes were taken out of the developer, rinsed with water and the time to get the first clean step was noted as the developing time. The results are summarized in Table 8.

Clean Up:

The number of sheets required before a clean image was printed was counted. When less than 20 sheets were needed, the performance was considered satisfactory. The results are summarized in Table 8.

Toning on Press

The image free parts were inspected after completion of the print job whether it took ink or not. The results are summarized in Table 8.

TABLE 8

Results of Examples 1 to 29 and Comparative Examples 1 to 7

| | Developer | plate # | developability (s) | photospeed | clean up | toning on press | length of run |
|---|---|---|---|---|---|---|---|
| Example 1 | D1 | 1 | 10 | 60 μJ/cm² | <20 | no | >20000 |
| Example 2 | D1 | 2 | 15 | 120 mJ/cm² | <20 | no | >20000 |
| Example 3 | D1 | 3 | 15 | 70 μJ/cm² | <20 | no | >20000 |
| Example 4 | D1 | 4 | 10 | 80 μJ/cm² | <20 | no | >20000 |
| Example 5 | D1 | 5 | 10 | 15 mJ/cm² | <20 | no | >20000 |
| Example 6 | D2a | 1 | 10 | 60 μJ/cm² | <20 | no | >20000 |
| Example 7 | D2a | 2 | 15 | 120 mJ/cm² | <20 | no | >20000 |
| Example 8 | D2b | 2 | 10 | 135 mJ/cm² | <20 | no | >20000 |
| Example 9 | D2c | 2 | 10 | 145 mJ/cm² | <20 | no | >20000 |
| Example 10 | D2d | 2 | 15 | 120 mJ/cm² | <20 | no | >20000 |
| Example 11 | D2e | 2 | 10 | 130 mJ/cm² | <20 | no | >20000 |
| Example 12 | D2a | 3 | 10 | 90 mJ/cm² | <20 | no | >20000 |
| Example 13 | D2a | 4 | 15 | 80 μJ/cm² | <20 | no | >20000 |
| Example 14 | D2a | 5 | 10 | 20 mJ/cm² | <20 | no | >20000 |
| Example 15 | D3a | 1[a)] | 10 | 50 μJ/cm² | <20 | no | >20000 |
| Example 16 | D3b | 1[a)] | 5 | 55 μJ/cm² | <20 | no | >20000 |
| Example 17 | D3c | 1[a)] | 10 | 50 μJ/cm² | <20 | no | >20000 |
| Example 18 | D3d | 1[a)] | 10 | 50 μJ/cm² | <20 | no | >20000 |
| Example 19 | D3e | 1[a)] | 5 | 45 μJ/cm² | <20 | no | >20000 |
| Example 20 | D4a | 1[a)] | 5 | 35 μJ/cm² | <20 | no | >20000 |
| Example 21 | D4b | 1[a)] | 5 | 45 μJ/cm² | <20 | no | >20000 |
| Example 22 | D4c | 1[a)] | 10 | 35 μJ/cm² | <20 | no | >20000 |
| Example 23 | D4d | 1[a)] | 5 | 30 μJ/cm² | <20 | no | >20000 |
| Example 24 | D4e | 1[a)] | 10 | 50 μJ/cm² | <20 | no | >20000 |
| Example 25 | D5a | 1[a)] | 10 | 50 μJ/cm² | <20 | no | >20000 |
| Example 26 | D5a | 1[a)] | 15 | 50 μJ/cm² | <20 | no | >20000 |
| Example 27 | D5a | 1[a)] | 10 | 50 μJ/cm² | <20 | no | >20000 |
| Example 28 | D5a | 1[a)] | 10 | 50 μJ/cm² | <20 | no | >20000 |
| Example 29 | D5a | 1[a)] | 10 | 55 μJ/cm² | <20 | no | >20000 |
| Comparative Example 1 | CD1 | 1 | 25 | 40 μJ/cm² | >50 | yes | Discontinued after 2000 impressions because of strong toning |
| Comparative Example 2 | CD1 | 4 | 20 | 40 μJ/cm² | >50 | yes | Discontinued after 2000 impressions because of strong toning |

TABLE 8-continued

Results of Examples 1 to 29 and Comparative Examples 1 to 7

| | Developer | plate # | developability (s) | photospeed | clean up | toning on press | length of run |
|---|---|---|---|---|---|---|---|
| Comparative Example 3 | CD1 | 5 | 25 | 10 mJ/cm$^2$ | >50 | yes | Discontinued after 2000 impressions because of strong toning |
| Comparative Example 4 | CD2 | 2 | 20 | 130 mJ/cm$^2$ | >50 | yes | Discontinued after 2000 impressions because of strong toning |
| Comparative Example 5 | CD3 | 1$^{a)}$ | 25 | 45 μJ/cm$^2$ | >50 | yes | Discontinued after 2000 impressions because of strong toning |
| Comparative Example 6 | CD4 | 1$^{a)}$ | 25 | 45 μJ/cm$^2$ | >50 | yes | Discontinued after 2000 impressions because of strong toning |
| Comparative Example 7 | CD5 | 1$^{a)}$ | 25 | 45 μJ/cm$^2$ | >50 | yes | Discontinued after 2000 impressions because of strong toning |

$^{a)}$plate was gummed with 850 S after developing

In Examples 1 to 14, the tests using the developers D1 and D2a-e in a single bath processing device without prewash or postrinse showed good clean up behavior and no toning on press at print start or restart.

Comparative Examples 1 to 4 using developers which contain alkaline agents and surfactants but no hydrophilic polymer according to the invention exhibited good developability however toning on press was severe.

The above results show that true single bath processing, which saves money and time by saving processing steps, press room chemical, rinsing water and space, can only be successfully achieved with processing liquids of the type described in this invention.

Examples 15 to 29 show that violet photopolymer plates can be developed and post sealed in one step using a substrate without interlayer. This results in improved adhesion and makes those plates FM capable.

It was also observed that the use of a hydrophilic polymer according to the present invention protects the image areas (i.e. printing areas) of the coating against attack by the alkaline solution.

The invention claimed is:

1. Method of producing an imaged lithographic printing plate comprising:
 (a) imagewise exposing a lithographic printing plate precursor,
 (b) treating the imagewise exposed lithographic printing plate precursor with an aqueous developer to provide a lithographic printing plate, the aqueous developer having a pH value of >6 and comprising
  (i) water,
  (ii) at least one hydrophilic polymer, comprising
   (m1) primary, secondary or tertiary amino groups, and
   (m2) acid groups selected from —COOH, —PO$_2$H$_2$ and —PO$_3$H$_2$, and
   (m3) optionally alkylene oxide units —(CHR$^1$—CH$_2$—O)$_p$—, wherein each R$^1$ independently represents H or —CH$_3$ and p is an integer from 1 to 50, and
  (iii) optionally at least one member selected from surfactants, alkaline reagents, water-soluble film forming hydrophilic polymers, additives selected from organic solvents, biocides, complexing agents, buffer substances, filter dyes, antifoaming agents, anticorrosive agents and radical inhibitors;
 and
 (c) directly after treating with the aqueous developer, drying the lithographic printing plate without further rinsing and gumming.

2. Method according to claim 1, wherein the lithographic printing plate precursor comprises a radiation-sensitive coating comprising one or more layers which is present on a substrate without interlayer.

3. Method according to claim 2, wherein the radiation-sensitive coating is sensitive to radiation of a wavelength selected from the range of 250 to 750 nm and imagewise exposure is carried out with radiation of a wavelength selected from the range of 250 to 750 nm.

4. Method according to claim 2, wherein the radiation-sensitive coating is sensitive to radiation of a wavelength selected from the range of more than 750 to 1200 nm and the imagewise exposure is carried out with radiation of a wavelength selected from the range of more than 750 to 1200 nm.

5. Method according to claim 1, wherein the primary, secondary, or tertiary amino groups are bound directly to a carbon atom of the polymer backbone either directly or via a spacer, or the acid groups are bound to carbon atoms of the polymer backbone either directly or via a spacer, or both kinds of groups are bound to a carbon atom of the polymer backbone either directly or via a spacer.

6. Method according to claim 1, wherein the nitrogen atom of the amino groups are part of the polymer backbone.

7. Method according to claim 1, wherein the acid groups are bound to the nitrogen atoms of the amino groups via a $C_1$-$C_4$ alkylene group.

8. Method according to claim 6, wherein the hydrophilic polymer (ii) comprises the following structural unit in the backbone:

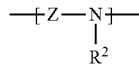

wherein Z is a straight chain or branched $C_1$-$C_3$ alkylene group and $R^2$ represents H, a $C_1$-$C_4$ alkyl, phenyl, or —X-AG group with X being a divalent straight chain or branched hydrocarbon group and -AG representing an acid group as defined in (m2).

9. Method according to claim 1, wherein the acid groups are —COOH groups.

10. Method according to claim 1, wherein the hydrophilic polymer (ii) is present in the aqueous developer in an amount of 0.01 to 15 wt % based on the total weight of the aqueous developer.

11. Method according to claim 1, wherein the developer has a pH of 10 to 13.5.

12. Method according to claim 1, wherein the aqueous developer comprises a surfactant or an alkaline reagent, or both a surfactant and an alkaline reagent.

13. Method according to claim 1, wherein the aqueous developer further comprises a water-soluble film forming hydrophilic polymer that is selected from dextrins and sugar alcohols.

14. Method according to claim 1, wherein the lithographic printing plate precursor comprises an overcoat which is optionally removed before step (a).

15. Method according to claim 1, wherein the method further comprises a preheat step before step (a).

16. Method according to claim 1, wherein the lithographic printing plate precursor comprises an overcoat and a radiation-sensitive coating, and wherein step (b) results in removing the overcoat as well as in removing the non-image areas of the radiation-sensitive coating and in providing a protective gumming in one single step.

17. Method of producing an imaged lithographic printing plate comprising:
(a) imagewise exposing a lithographic printing plate precursor,
(b) treating the imagewise exposed lithographic printing plate precursor with an aqueous developer to provide a lithographic printing plate, the aqueous developer having a pH value of >6 and comprising
(i) water,
(ii) at least one hydrophilic polymer,
comprising
(m1) primary, secondary or tertiary amino groups, wherein the primary, secondary, or tertiary amino group is either (a) bound directly to a carbon atom of the backbone of the hydrophilic polymer, (b) bound to the backbone of the hydrophilic polymer with a $C_1$-$C_4$ alkylene group, or (c) the nitrogen atom of an amino group is part of the backbone of the hydrophilic polymer, and
(m2) acid groups selected from —COOH, —$SO_3H$, —$PO_2H_2$ and —$PO_3H_2$, and
(m3) optionally alkylene oxide units —$(CHR^1$—$CH_2$—$O)_p$—, wherein each $R^1$ independently represents H or —$CH_3$ and p is an integer from 1 to 50, and
(iii) optionally at least one member selected from surfactants, alkaline reagents, water-soluble film forming hydrophilic polymers, additives selected from organic solvents, biocides, complexing agents, buffer substances, filter dyes, antifoaming agents, anticorrosive agents and radical inhibitors;
and
(c) directly after treating with the aqueous developer, drying the lithographic printing plate without further rinsing and gumming.

18. The method of claim 1, wherein the hydrophilic polymer is a sulfobetaine.

19. The method of claim 1, wherein after drying, the lithographic printing plate is used for lithographic printing.

* * * * *